US006008062A

United States Patent [19]

Knall

[11] Patent Number: 6,008,062

[45] Date of Patent: Dec. 28, 1999

[54] UNDERCUTTING TECHNIQUE FOR CREATING COATING IN SPACED-APART SEGMENTS

[75] Inventor: N. Johan Knall, Sunnyvale, Calif.

[73] Assignee: Candescent Technologies Corporation, San Jose, Calif.

[21] Appl. No.: 08/962,527

[22] Filed: Oct. 31, 1997

[51] Int. Cl.$^6$ .................................................... H01L 21/00

[52] U.S. Cl. ................................ 438/20; 445/50; 445/51; 313/310; 313/312; 313/336; 313/351; 427/10; 427/77

[58] Field of Search ................................ 438/20; 445/50, 445/51; 313/310, 312, 336, 351; 427/10, 77

[56] References Cited

U.S. PATENT DOCUMENTS

| | | | |
|---|---|---|---|
| 3,755,704 | 8/1973 | Spindt et al. | 313/309 |
| 5,164,632 | 11/1992 | Yoshida et al. | 313/309 |
| 5,199,917 | 4/1993 | MacDonald et al. | 445/24 |
| 5,462,467 | 10/1995 | Macaulay et al. | 445/50 |
| 5,559,389 | 9/1996 | Spindt et al. | 313/310 |
| 5,564,959 | 10/1996 | Spindt et al. | 445/24 |

FOREIGN PATENT DOCUMENTS

| | | |
|---|---|---|
| 0508737 A1 | 10/1992 | European Pat. Off. . |
| WO 93/18536 | 9/1993 | WIPO . |

OTHER PUBLICATIONS

Huang, "200–nm Gated Field Emitters," *IEEE Electron Device Letters,* Mar. 1993, pp. 121–122.

Brodie et al, "Vacuum Microelectronics," *Advances in Electronics and Electron Physics,* vol. 83, 1992, pp. 1–106.

Betsui, "Fabrication and Characteristics of Si Field Emitter Arrays," *Tech. Dig. IVMC 91,* 1991, pp. 26–29.

Busta, "Vacuum microelectronics—1992," *J. Micromech. Microeng.,* vol. 2, 1992, pp. 43–74.

*Primary Examiner*—John F. Niebling
*Assistant Examiner*—David A. Zarneke
*Attorney, Agent, or Firm*—Skjerven, Morrill, MacPherson, Franklin & Friel LLP; Ronald J. Meetin

[57] ABSTRACT

A technique for creating a patterned coating entails forming a first region (26) over a primary component (22). A second region (28) is formed over part of the first region. The first region is etched so as to undercut the second region, thereby forming a gap (30) below part of the second region. Coating material is then provided over the structure. Due to the presence of the gap, the coating material accumulates over the structure in a pair of segments spaced apart along the gap. One coating segment (32A) overlies the primary component. The other coating segment (32B) overlies the second region.

44 Claims, 10 Drawing Sheets

46A
48
50C
46B
100
46C
44
42
52
46A
40

102
104
106
50C
100A
44A
46A
52
54
46B
46C 108C
108B
104A
104B
100A
44A
46A
108A
108A
50C
46B
46C 112B
112C
114A
114A
114B
114B
112A
114C
112A
112A
112A
100A
44A
46A
108A
108B
104A
108C
104B
46B
46C

UNDERCUTTING TECHNIQUE FOR CREATING COATING IN SPACED-APART SEGMENTS

CROSS-REFERENCE TO RELATED APPLICATION

This is related to Knall, co-filed U.S. patent application Ser. No. 08/962,525, attorney docket no. CT-C092 US. The contents of Knall are incorporated by reference to the extent not repeated herein.

FIELD OF USE

This invention relates to techniques for creating a coating (or layer) having multiple segments. In particular, this invention relates to techniques for creating segmented coatings during the fabrication of electron-emitting devices, especially electron emitters employed in flat-panel cathode-ray tube ("CRT") displays of the field-emission type.

BACKGROUND ART

A field-emission cathode (or field emitter) contains a group of electron-emissive elements that emit electrons upon being subjected to an electric field of sufficient strength. The electron-emissive elements are typically situated over a patterned layer of emitter electrodes. In a gated field emitter, a patterned gate layer typically overlies the patterned emitter layer at the locations of the electron-emissive elements. Each electron-emissive element is exposed through an opening in the gate layer. When a suitable voltage is applied between a selected portion of the gate layer and a selected portion of the emitter layer, the gate layer extracts electrons from the electron-emissive elements at the intersection of the two selected portions.

In fabricating a field emitter, there are normally multiple instances in which one segment of a coating needs to be spaced apart from another segment of the coating. Various conventional techniques are available for achieving the desired separation between the coating segments.

For example, the coating can be deposited as a blanket layer and then photolithographically patterned to remove part of the blanket layer, thereby creating the separation. However, the field emitter may occasionally become contaminated or otherwise damaged by the photolithographic patterning materials, including (a) the photoresist used to cover the coating segments intended to remain in the structure after the patterning operation, (b) the photoresist developer employed to remove the photoresist above where part of the blanket layer is to be removed, and (c) the etchant utilized to remove that part of the blanket layer. Also, the photolithographic masking technique typically does not work well over surfaces having rough topography.

Another conventional technique is to selectively deposit the coating material using a mask, commonly termed a shadow mask, situated above the field emitter to prevent the coating material from accumulating on areas where no coating material is desired. By using the shadow masking technique, the likelihood of contaminating or otherwise damaging the field emitter is normally reduced to a low level. Unfortunately, the shadow masking technique normally cannot be utilized to accurately define fine (or small) features, especially features of the fineness typically needed in the active area of a field emitter. It is desirable to have a technique for providing a coating in multiple finely defined segments over a relatively rough surface of a field emitter.

GENERAL DISCLOSURE OF THE INVENTION

The present invention furnishes techniques for accurately creating a coating (or layer) in multiple segments spaced apart generally along a gap in the topography over which the coating is formed. The separation between the coating segments is produced when coating material is provided (e.g., deposited) over the underlying topography.

Unlike conventional photolithographic patterning, the segment separation in the invention is not produced by removing part of the coating material. No photolithographic pattern-defining material such as photoresist needs to be used in defining the segment separation in the invention. Consequently, the coating technique of the invention avoids contamination and other damage that commonly arise from photolithographic patterning. Also, in contrast to photolithographic patterning where roughness in the underlying topography significantly limits the ability to use photolithography for accurately creating a pattern, surface roughness does not significantly hinder usage of the present coating technique.

The segments of the coating created according to the invention typically have a finely defined shape. The invention thus overcomes the inability of the shadow masking technique to accurately produce fine features.

More particularly, a method in accordance with the invention entails creating a first region over a primary component. A second region is formed over part of the first region. The first region is then etched so as to undercut the second region and form a gap below part of the second region. The etch is normally performed in a manner that is at least partially isotropic, typically with a liquid etchant.

With the second region being so undercut, a coating material is provided over the primary component and the second region. Due to the presence of the gap, the coating material accumulates over the primary component and the second region in a pair of segments spaced apart along the gap. One of the coating segments overlies the primary component. The other segment overlies the second region. The second coating segment typically extends over a further component spaced laterally apart from the primary component.

A physical deposition procedure is preferably employed to provide the coating material over the underlying topography. Specifically, the coating material is normally deposited at a principal incidence angle of 20–90° to the upper surface of a substructure underlying the primary component. Uniformity in the deposition can be enhanced by depositing the coating material from a deposition source which is translated relative to the substructure or/and is rotated, relative to the substructure, about an axis approximately perpendicular to the upper surface of the substructure.

An application of the present coating technique to the fabrication of an electron-emitting device involves furnishing an initial structure that contains a control electrode, a dielectric layer, a further layer, and multiple electron-emissive elements. The further layer overlies the control electrode which overlies the dielectric layer. The electron-emissive elements are situated in composite openings extending through the control electrodes and the dielectric layer.

A first region is created over the further layer and the control electrode. A second region is created over part of the first region after which the first region is etched in the undercutting manner described above to form a gap below part of the second region. The coating material is provided over the control electrode, the further layer, and the second region to form first and second coating segments spaced apart along the gap. The first coating segment overlies the further layer and the control electrode. The second coating segment overlies the second region.

The further layer typically overlies the control electrode above the electron-emissive elements and is formed from the emitter material utilized in forming at least part of each electron-emissive element. In such a case, the further layer is typically removed subsequent to forming the coating segments. The overlying material of the first coating segment is likewise removed. The second coating segment then typically forms at least part of a system for focusing electrons emitted by the electron-emissive elements.

In short, the coating technique of the invention readily enables multiple accurately defined coating a segments to be formed over a rough topography without incurring significant contamination or other degradation problems. The invention thus provides a substantial advance over the prior art.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

Figure 1A:
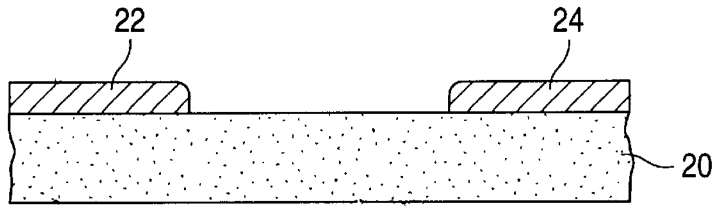
FIGS. 1*a*–1*e* are cross-sectional structural views representing steps in a general technique that employs the invention's teaching for creating a coating having segments that are spaced apart from one another.

In the present invention, a product is furnished with a coating having spaced apart segments. When the product is a gated field-emission cathode, part of the coating typically forms a component of a system that focuses electrons emitted by electron-emissive elements in the field-emission cathode. The field emitter is suitable for exciting light-emissive phosphor regions of a light-emitting device in a cathode-ray tube of a flat-panel display such as a flat-panel television or a flat-panel video monitor for a personal computer, a lap-top computer, or a workstation.

In the following description, the term "electrically insulating" or "dielectric" generally applies to materials having a resistivity greater than $10^{10}$ ohm-cm. The term "electrically non-insulating" thus refers to materials having a resistivity below $10^{10}$ ohm-cm. Electrically non-insulating materials are divided into (a) electrically conductive materials for which the resistivity is less than 1 ohm-cm and (b) electrically resistive materials for which the resistivity is in the range of 1 ohm-cm to $10^{10}$ ohm-cm. Similarly, the term "electrically non-conductive" refers to materials having a resistivity of at least 1 ohm-cm, and includes electrically resistive and electrically insulating materials. These categories are determined at an electric field of no more than 1 volt/$\mu$m.

FIGS. 1*a*–1*e* (collectively "FIG. 1") illustrate generally how a coating is formed in multiple spaced apart segments in accordance with the invention. The starting point for the process sequence of FIG. 1 is a substructure 20 having a relatively flat upper surface. See FIG. 1*a*.

Substructure 20 can be configured in various ways and can consist of various combinations of electrically insulating, electrically resistive, and electrically conductive materials. The material of substructure 20 along its upper surface is normally electrically insulating. When the process sequence of FIG. 1 is employed in fabricating a gated field emitter such as that manufactured according to the process of FIGS. 2*a*–2*i* or 7*a*–7*g*, or according to the process variation of FIGS. 5*a*–5*d* or 6*a* and 6*b*, substructure 20 typically consists of an electrically insulating baseplate (40), an overlying electrically non-insulating region (42), and a dielectric layer (44) situated above the non-insulating region.

A primary component 22 and a further component 24 are situated on top of substructure 20 at laterally separated locations. Each of components 22 and 24 normally consists of electrically non-insulating material, preferably electrically conductive material. In a typical implementation, components 22 and 24 are formed with metal such as aluminum, chromium, or/and nickel. Nevertheless, components 22 and 24 can be formed with electrically non-conductive material, including electrically insulating material.

Components 22 and 24 are usually created at the same time and are therefore of largely the same thickness. For example, components 22 and 24 can be formed by depositing a blanket layer of a suitable component material on substructure 20 and then removing the material situated between the intended locations for components 22 and 24. The removal step can be performed with an etchant utilizing a suitable mask, such as a photoresist mask. Alternatively, components 22 and 24 can be formed by selectively depositing the component material. Components 22 and 24 can also be created in separate operations using a blanket deposition/selective removal technique or a selective deposition technique to form each component 22 or 24.

Figure 1B:
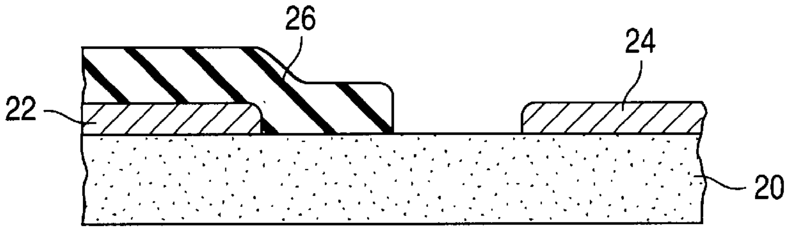

A first region 26 is formed on at least part of primary component 22 and extends over substructure 20 in the space between components 22 and 24 as shown in FIG. 1*b*. First region 26 typically covers all of primary component 22 and none of further component 24. When components 22 and 24 consists of electrically conductive material, region 26 normally consists of electrically non-conductive material. In a typical implementation, region 26 consists of electrically insulating material such as silicon oxide or silicon nitride. However, region 26 can be formed with electrically conductive material, especially when primary region 22 consists of electrically non-conductive material. The thickness of the part of region 26 situated above primary component 22 is normally chosen to be greater than the thickness of the coating later formed in multiple spaced apart segments.

Various techniques can be employed to create first region 26. For example, region 26 can be formed by depositing a suitable layer of material on top of the structure and then removing the material at the location where region 26 is not intended to be. As with the blanket deposition/selective removal technique employed to form components 22 and 24, the removal steps here can be performed by etching the layer using a suitable mask. Region 26 can also be formed by a selective deposition technique. In particular, a shadow mask can be employed to prevent the material of region 26 from accumulating over the structure at the location where region 26 is not intended to be.

Figure 1C:
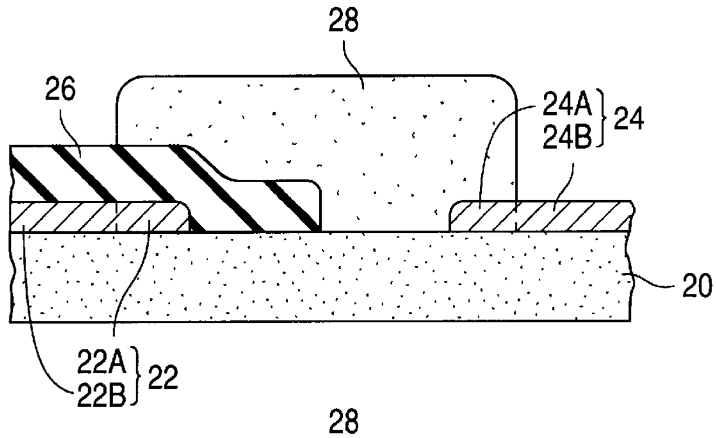

A second region 28 is formed on part of first region 26. See FIG. 1*c*. First region 26 separates second region 28 from primary component 22. Second region 28 may extend above primary component 22. In the example of FIG. 1*c*, region 28 extends above a part 22A of primary component 22. The remainder of primary component 22 is indicated as item 22B in FIG. 1*c*. If region 28 does not extend over part of primary component 22, the lateral separation between region 28 and component 22 is typically small, but can be large.

Second region 28 may be formed on part of further component 24. In the example of FIG. 1*c*, region 28 lies on a part 24A of further component 24. The remainder of component 24 is indicated as item 24B. If region 28 is not formed on part of component 24, the lateral separation between region 28 and component 24 is typically small, but can be large.

Second region 28 can be formed with electrically insulating, electrically resistive, or electrically conductive material, or with a combination of two or more of these three general types of material. This applies regardless of whether components 22 consist of electrically conductive or electrically non-conductive material. In a typical implementation, region 28 consists of electrically insulating material, specifically electrically insulating material such as polyimide.

Various techniques can be employed to create second region 28. As with components 22 and 24 and first region 26, second region 28 can be formed by a blanket deposition/ selective removal technique or by a selective deposition technique. When region 28 consists of polyimide, a blanket layer of a suitable photopatternable polyimide is formed on top of the structure. This typically entails depositing, spinning, and appropriately baking the polyimide. The portion of the blanket photopolymerizable layer intended to form region 28 is exposed to suitable actinic radiation, typically ultraviolet ("UV") light, through a photomask. The actinic radiation causes the exposed polyimide to polymerize and change chemical structure. The unexposed polyimide is removed with a suitable developer. The remaining (i.e., exposed) polyimide is then typically cured to complete the formation of region 28.

Figure 1D:
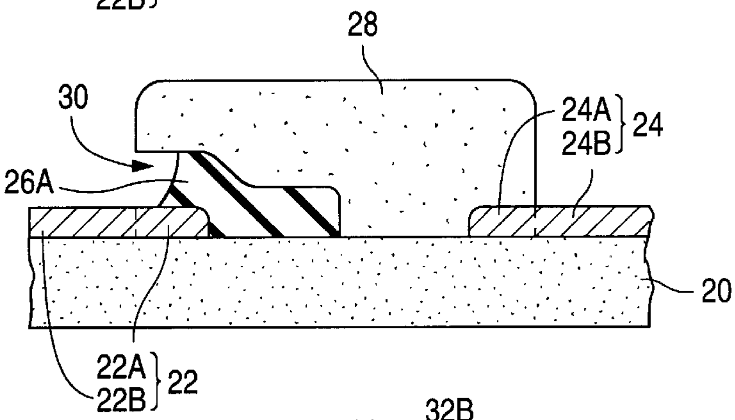
Figure 1E:
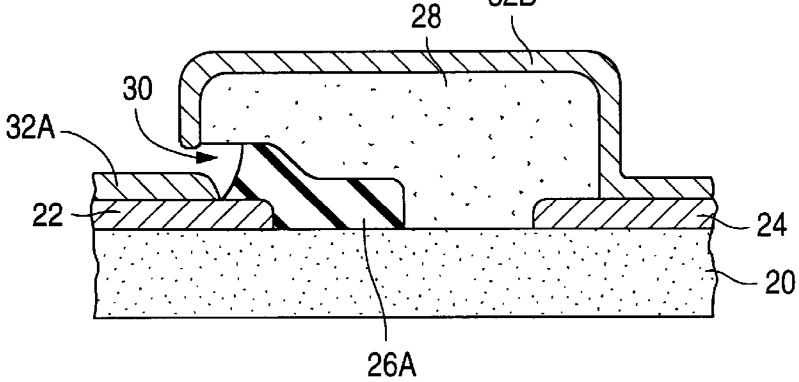

Using second region 28 as an etch shield (or mask), the unshielded part of first region 26 is removed with a suitable etchant. The etch is continued into the material of first region 26 underlying second region 28 so as to undercut region 28 slightly as shown in FIG. 1*d*. A gap 30 is thus formed below region 28. In the example of FIG. 1*d*, gap 30 overlies a portion of part 22A of primary component 22. The height of gap 30 approximately equals the thickness of first region 26. The etchant normally has a substantial isotropic component. A liquid chemical etchant is typically utilized to etch region 26 and form gap 30.

A coating material is deposited on top of the structure. See FIG. 1*e*. The coating material accumulates (a) on primary component 22 to form a first coating segment 32A and (b) on second region 28 and further component 24 to form a second coating segment 32B.

The coating deposition is performed in such a way that coating segments 32A and 32B are separated along gap 30. To achieve the separation, the average thickness of segments 32A and 32B is normally less than the original thickness of first region 26. Specifically, the thickness of coating segment 32A at gap 30—i.e., directly below the left-hand edge of second region 28 in FIG. 1*d*—is less than the original thickness of first region 26 directly below the left-hand edge of region 28. Nonetheless, due to the shadowing characteristics of certain of the deposition techniques that can be utilized to form coating segments 32A and 32B, the average thickness of coating segments 32A and 32B can exceed the original thickness of region 26.

The coating deposition is typically performed according to a low-pressure line-of-sight physical vapor deposition technique such as evaporation or sputtering. The coating material is deposited at a principal incidence angle of 20–90° to the upper surface of substructure 20. To make the thickness of coating segments 32A and 32B more uniform, substructure 20 (including the overlying components/ regions) and the source of the coating material can be translated relative to each other during the deposition or/and rotated relative to each other during the deposition about an axis perpendicular to the upper surface of substructure 20. Whether translation or rotation is utilized to enhance the deposition uniformity depends on factors such as the particular technique employed to deposit coating segments 32A and 32B, the physical size of the deposition source relative to the lateral area of substructure 20, and the geometry of the deposition source.

When coating segments 32A and 32B are created by sputtering, the size of the sputter coating material deposition source is typically substantial compared to the lateral area of substructure 20. As a result, translation of the sputter deposition source and substructure 20 relatively to each other is normally sufficient to achieve relative uniform deposition. The principal deposition angle is typically 90° for sputtering.

When coating segments 32A and 32B are created by evaporation, the source of the evaporated coating material is typically small compared to the lateral area of substructure 20. A combination of translation and rotation is typically employed in the evaporation case. For evaporation, the principal incidence angle is typically 60°. An example of the deposition geometry particularly suitable for evaporation is presented below in connection with FIGS. 4*a* and 4*b*.

Coating segments 32A and 32B normally consist of electrically non-insulating material, preferably electrically conductive material, when components 22 and 24 consists of electrically conductive material. In a typical embodiment, the coating material is a metal such as aluminum. First coating segment 32A then makes ohmic contact with primary component 22. Second coating segment 32B, which is spaced apart from first coating segment 32A, makes ohmic contact with further component 24, which is similarly spaced apart from primary component 22. Alternatively, the coating material can be electrically insulating.

The deposition of coating segments 32A and 32B completes the process sequence of FIG. 1. In some cases, additional processing may be performed to remove first coating segment 32A. In other cases, further component 24 may be absent.

FIGS. 2*a*–2*i* (collectively "FIG. 2") illustrate a process for manufacturing a gated field emitter of a flat-panel CRT display in accordance with the invention. The coating segmentation principles utilized in the process sequence of FIG. 1 are employed in the process of FIG. 2 for creating a focus coating of a system that focuses electrons emitted by the field emitter. The electrons excite light-emissive elements in the light-emitting device situated across from the field emitter. FIGS. 3*a* and 3*b* present layout views of the field emitter at the respective fabrication stages of FIGS. 2*b* and 2*i*.

The starting point in the process of FIG. 2 is a flat electrically insulating baseplate (or substrate) 40. See FIG. 2*a*. Baseplate 40, which provides support for the field emitter, typically consists of glass, such as Schott D263 glass, having a thickness of approximately 1 mm.

A lower electrically non-insulating emitter region 42 overlies baseplate 40. Lower non-insulating region 42 contains an electrically conductive layer patterned into a group of laterally separated emitter electrodes. Letting the direction of the rows of picture elements (pixels) in the flat-panel CRT display be referred to as the row direction, the emitter electrodes of region 42 extend generally parallel to one another in the row direction so as to constitute row electrodes.

Figure 2A:
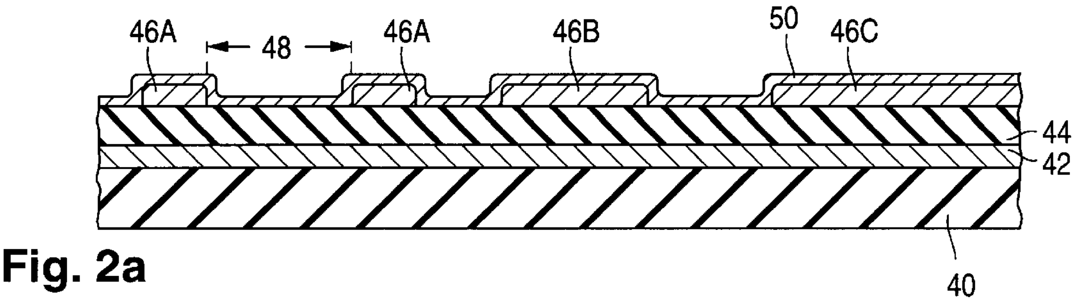
FIGS. 2*a*–2*i* are cross-sectional structural views representing steps in manufacturing a gated field emitter according to the invention.
Figure 3A:
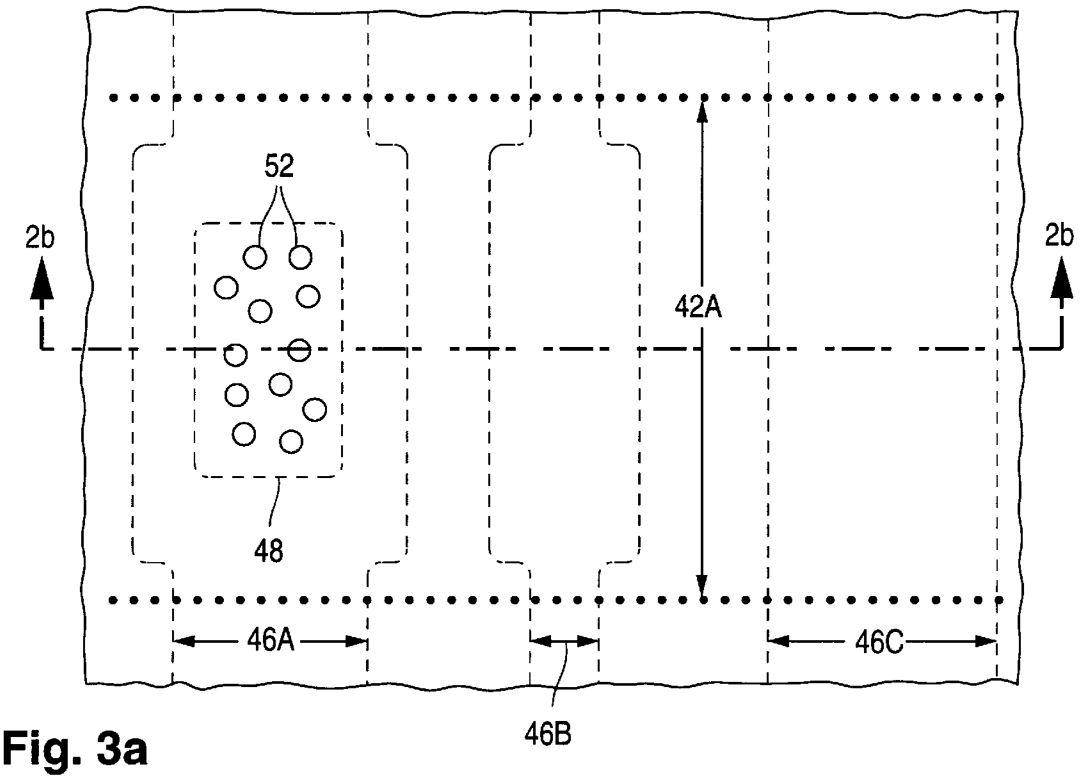
FIGS. 3*a* and 3*b* are layout view of the respective structures in FIGS. 2*b* and 2*i*. The cross section of FIG. 2*b* is taken through plane 2*b*—2*b* in FIG. 3*a*. The cross section of FIG. 2*i* is similarly taken through plane 2*i*—2*i* in FIG. 3*b*.
Figure 3B:
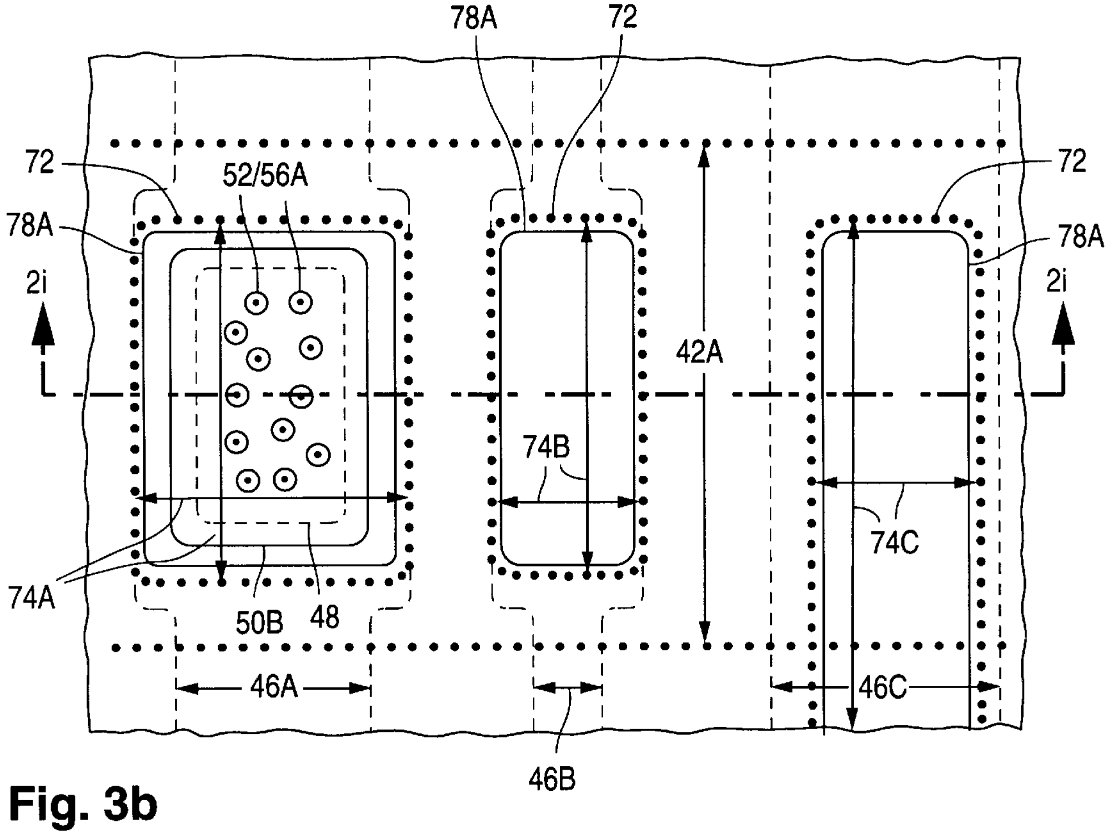

For simplicity, the emitter row electrodes of non-insulating region 42 are depicted as extending fully across the structure shown in FIG. 2*a*. In actuality, the emitter electrodes typically terminate approximately one third of the way from the right-hand side of FIG. 2*a*. The emitter electrodes typically consist of metal such as aluminum or nickel, or an alloy of either of these metals. The thickness of the emitter electrodes is 0.1–0.5 $\mu$m, typically 0.2 $\mu$m.

An electrically resistive layer typically overlies the emitter electrodes in lower non-insulating region 42. Candidate materials for the resistive layer include cermet (ceramic with embedded metal particles) and silicon-carbon-nitrogen compounds, including silicon carbide. The resistive layer provides a resistance of $10^6$–$10^{11}$ ohms, typically $10^9$ ohms, between each electron-emissive element and the underlying emitter electrode.

An electrically insulating layer 44, which serves as the interelectrode dielectric, is provided on top of non-insulating region 42. The thickness of dielectric layer 44 is 0.05–3 $\mu$m, typically 0.15 $\mu$m. Dielectric layer 44 typically consists of silicon oxide or silicon nitride. Although not shown in FIG. 2*a*, parts of dielectric layer 44 may contact baseplate 40 depending on the configuration of non-insulating region 42.

A group of laterally separated main control electrodes 46A are situated on top of dielectric layer 44 in the active device area, i.e., the area in which electrons emitted by the electron-emissive elements emit electrons that cause an image to appear on the viewing surface of the light-emitting device. One main control electrode 46A is depicted in FIG. 2*a*. Control electrodes 46A extend generally perpendicular to the emitter electrodes of lower non-insulating region 42. That is, control electrodes 46A extend in the direction of the columns of pixels so as to constitute main column electrodes.

A group of laterally separated control apertures 48 extend through each main control electrode 46A down to dielectric layer 44. Control apertures 48 in each electrode 46A respectively overlie the emitter electrodes of non-insulating region 42. Accordingly, control apertures 48 form a two-dimensional array of rows and columns of control apertures.

A pair of dummy main control electrodes 46B are situated on dielectric layer 44 at the column-direction edges of the active area. That is, one dummy electrode 46B is located before the first main control electrode 46A while the other dummy electrode 46B is located after the last main control electrode 46A. Electrodes 46B, one of which is shown in FIG. 2*a*, thus extend in the column direction so as to constitute dummy column electrodes. No control apertures (analogous to control apertures 48) extend through dummy electrodes 46B. Although the illustrated dummy electrode 46B is shown in FIG. 2*a* as being narrower (in the row direction) than the illustrated main control electrode 46A, this is only due to drawing space limitations. Dummy electrodes 46B are typically of the same width as main control electrodes 46A.

An additional electrical conductor 46C is situated on dielectric layer 44 in the peripheral device area beyond control electrodes 46A and 46B, and extends in the column direction. As indicated below, additional conductor 46C is utilized to provide a focus control potential to the later produced focus coating. When the emitter electrodes of non-insulating region 42 extend only partway across the structure of FIG. 2*a*, the emitter electrodes typically terminate at a location below the space between dummy control electrodes 46B, on one hand, and additional conductor 46C, on the other hand, thereby substantially avoiding the possibility of having the emitter electrodes become short circuited to conductor 46C.

Conductors 46A–46C are normally created at the same time by depositing a blanket layer of electrically conductive control material and then patterning the blanket control layer. Conductors 46A–46C normally consist of metal, typically chromium having a thickness of 0.1–0.5 $\mu$m, typically 0.2 $\mu$m. Alternative metals for conductors 46A–46C are aluminum, nickel, tantalum, and tungsten.

Each main control electrode 46A corresponds to primary component 22 in the process sequence of FIG. 1. Alternatively, the illustrated dummy electrode 46B can correspond to primary component 22. Additional conductor 46C corresponds to further component 24.

A blanket electrically non-insulating gate layer 50 is situated on top of the structure in FIG. 2*a*. Specifically, gate layer 50 overlies conductors 46A–46C and extends down to dielectric layer 44 in the spaces between conductors 46A–46C. Gate layer 50 also extends into control apertures 48 down to dielectric layer 44. Gate layer 50 normally consists of metal, typically chromium having a thickness of 0.02–0.1 $\mu$m, typically 0.04 $\mu$m. Alternative metals for layer 50 are tantalum, gold, and tungsten.

Figure 2B:
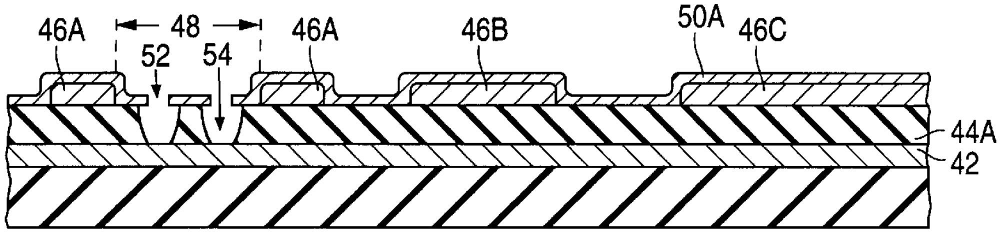

Gate openings 52 are created through gate layer 50 down to dielectric layer 44 within control apertures 48 as shown in FIG. 2*b*. Item 50A in FIG. 2*b* is the remainder of gate layer 50. Gate openings 52 are typically created according to a charged-particle tracking procedure of the type described in U.S. Pat. No. 5,559,389 or 5,564,959. Openings 52 can also be created according to a sphere-based technique of the type described in Haven et al, U.S. patent application Ser. No. 08/660,536, filed Jun. 7, 1996, or Ludwig et al, U.S. patent application Ser. No. 08/660,538, also filed Jun. 7, 1996.

The portion of remaining gate layer 50A at the bottom of each control aperture 48 contains multiple gate openings 52. The combination of a control aperture 48 and the particular gate openings 52 extending through the portion of gate layer 50A spanning that aperture 48 form a composite control aperture 48/52. Since control apertures 48 are arranged in a two-dimensional row/column array, gate openings 52 are arranged in a two-dimensional array of rows and columns of sets of multiple gate openings. See FIG. 3*a* in which one of the sets of gate openings 52 is depicted. Item 42A in FIG. 3*a* represents one of the emitter row electrodes of non-insulating region 42. As indicated in FIG. 3*a*, each control electrode 46A or 46B is wider over emitter electrodes 42A than in the spaces between electrodes 42A.

Using gate layer 50A as an etch mask, dielectric layer 44 is etched through gate openings 52 to form dielectric openings 54 down to non-insulating region 42. Item 44A in FIG. 2*b* is the remainder of dielectric layer 44. The etch to create dielectric openings 54 is normally performed in such a manner that openings 54 undercut gate layer 50A somewhat. Each dielectric opening 54 and the overlying gate opening 52 form a composite opening 52/54.

Figure 2C:
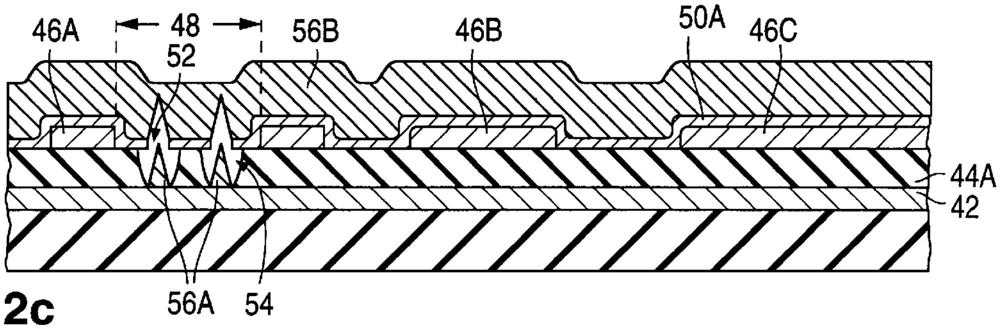
Figure 2D:
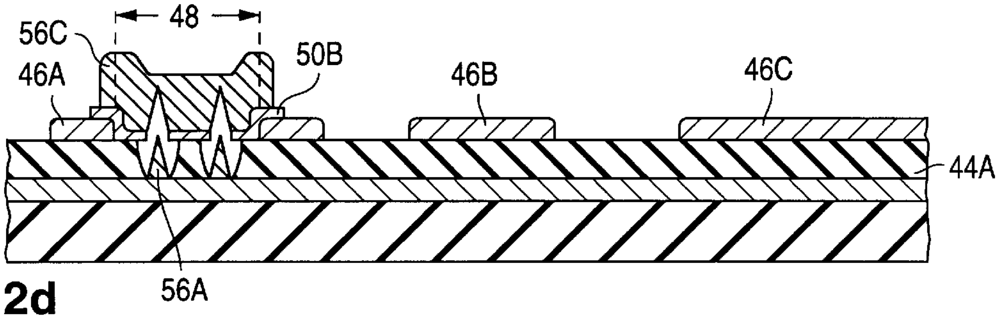

Referring to FIG. 2*c*, electrically non-insulating emitter cone material is evaporatively deposited on top of the structure in a direction generally perpendicular to the upper (or lower) surface of baseplate 40. The emitter cone material accumulates on the exposed portions of gate layer 50A and passes through gate openings 52 to accumulate on lower non-insulating region 42 in dielectric openings 54. Due to the accumulation of the emitter material on gate layer 50A, the openings through which the emitter material enters openings 54 progressively close. The deposition is performed until these openings fully close. As a result, the emitter material accumulates in dielectric openings 54 to form corresponding conical electron-emissive elements 56A. A continuous (blanket) excess layer 56B of the emitter material simultaneously accumulates on gate layer 50A.

The emitter cone material is normally metal, preferably molybdenum when gate layer 50 consists of chromium. Alternative candidates for the emitter material include nickel, chromium, platinum, niobium, tantalum, titanium, tungsten, titanium-tungsten, and titanium carbide subject to the emitter material differing from the gate material when an electrochemical technique is later employed to remove one or more portions of excess emitter-material layer 56B.

A photoresist mask (not shown) is formed on top of excess emitter-material layer 56B. The photoresist mask has solid masking portions which are situated fully above control apertures 48 and which extend partially above adjoining portions of main control electrodes 46A. Preferably, each solid masking portion is generally in the shape of a rectangle that overlies a corresponding one of control apertures 48 and is laterally separated from masking portions that overlie the other control apertures 48 in the same control electrode 46B.

The material of excess emitter-material layer 56B exposed through the photoresist mask is removed with a suitable etchant. See FIG. 2*d* in which item 56C indicates the remainder of excess layer 56B. Excess emitter-material remainder 56C consists of a two-dimensional array of rows and columns of rectangular islands that respectively extend fully across, and thus fully occupy, control apertures 48. The etchant is typically a chemical etchant and thus has an isotropic component. Consequently, excess emitter-material islands 56C undercut the photoresist slightly. Gate layer 50A is now partially exposed.

With the photoresist mask still in place, blanket gate layer 50A is selectively etched to produce patterned gate layer 50B. The gate etch is usually performed with a largely anisotropic etchant, typically a chlorine plasma, in a direction generally perpendicular to the upper surface of baseplate 40 so that gate layer 50B does not significantly undercut the photoresist mask. Since an etchant with an isotropic component was employed in selectively etching excess emitter-material layer 56B whereas a fully anisotropic etchant was utilized in selectively etching blanket gate layer 50A through the same photoresist mask, the resulting portions of gate layer 50B respectively extend laterally outward slightly beyond excess emitter-material islands 56C.

Alternatively, blanket gate layer 50A can be patterned with an etchant having an isotropic component to reduce or substantially eliminate the lateral extension of gate portions 50B beyond excess emitter-material islands 56C. The lateral extension of gate portions 50B beyond excess islands 56C can also be reduced or substantially eliminated by patterning excess layer 56B with a largely anisotropic etchant. In any event, each main control electrode 46A and the adjoining gate portions 50B form a composite control electrode 46A/50B extending in the column direction. Rather than just each main control electrode 46A corresponding to primary component 22 in the process sequence of FIG. 1, the combination of each main control electrode 46A and the adjoining gate portions 50B, i.e., each composite control electrode 46A/50B, can correspond to primary component 22.

Figure 2E:
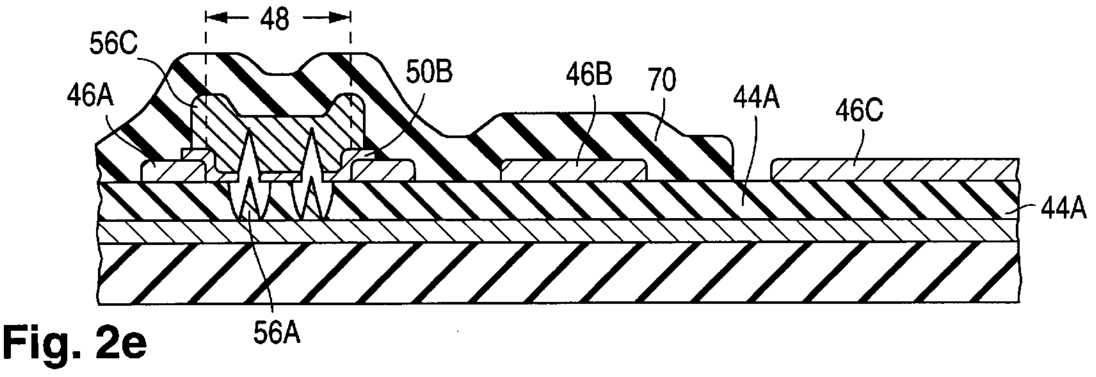

A patterned multi-function layer 70 is formed on top of the structure as shown in FIG. 2*e*. Patterned layer 70 lies on the top and side surfaces of excess emitter-material islands 56C, extends over the uncovered material of gate portions 50B and main control electrodes 46A, covers dummy electrodes 46B, covers the portions of dielectric layer 44A situated variously between electrodes 46A and 46B, and extends over dielectric layer 44A beyond dummy electrodes 46B but leaves additional conductor 46C uncovered. In this aspect, layer 70 corresponds to, and thus performs the function of, first region 26 in the process sequence of FIG. 1.

As discussed below, a system that focuses electrons emitted by electron-emissive cones 56A is formed on top of the structure during the period in which excess emitter-material islands 56C overlie cones 56A. Molybdenum, the material preferably used to form cones 56A and thus the material that preferably forms excess islands 56C, provides excellent electron-emission characteristics but, when deposited by evaporation as is done here, is porous to certain of the materials utilized in forming the electron focusing system. Patterned layer 70 is chosen to be of such type and thickness as to be largely impervious to these materials. By having appropriate parts of layer 70 overlie excess islands 56C when the structure is exposed to these materials, layer 70 prevents the materials from passing through excess islands 56C and contaminating or otherwise damaging cones 56A. In other words, layer 70 protects cones 56A during the formation of the electron focusing system.

Portions of protective layer 70 are typically present in the final field emitter. Accordingly, the material and thickness of protective layer 70 are chosen to conform to the functions performed by adjacent components of the field-emitter. Layer 70 typically consists of electrically non-conductive material, normally electrically insulating material. When portions of layer 70 underlie a base focusing structure of the electron focusing system, layer 70 consists of silicon oxide having a thickness of 0.05–1.0 $\mu$m, typically 0.5 $\mu$m. Silicon nitride and spin-on glass are alternative materials for layer 70.

Protective layer 70 is typically formed by sputter depositing a blanket layer of the desired protective material on top of the structure. The blanket protective layer can also be formed by chemical vapor deposition. Using a suitable photoresist mask (not shown) the undesired portions of the blanket protective layer are removed with a suitable etchant to produce layer 70. Alternatively, layer 70 can be created according to a shadow mask deposition technique.

Figure 2F:
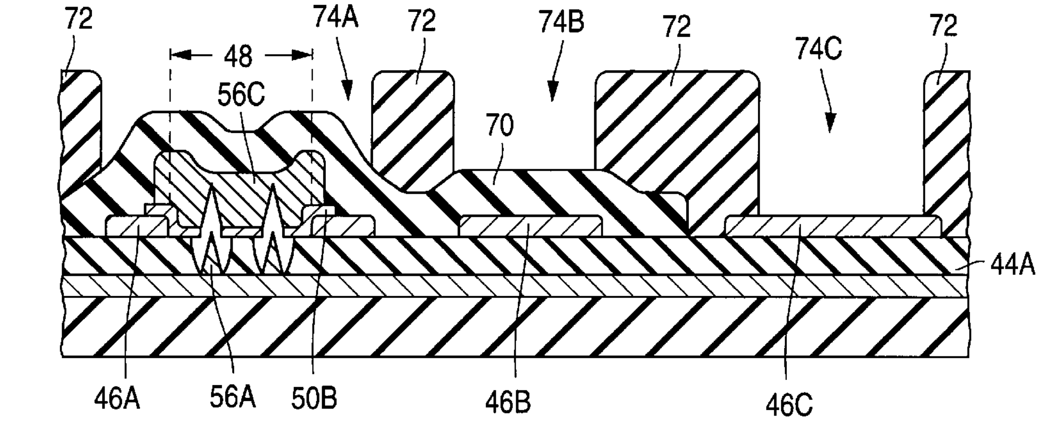

An electrically non-conductive base focusing structure 72 for the electron focusing system is formed on top of the partially finished field emitter as shown in FIG. 2*f*. Base focusing structure 72 corresponds to second region 28 in the process sequence of FIG. 1. The portions of focusing structure 72 shown in FIG. 2*f* are connected together outside the plane of the figure.

An array of rows and columns of generally rectangular focus openings 74A extend through base focusing structure 72 in the active device area. As viewed perpendicularly to the upper surface of baseplate 40, each control aperture 48 is situated laterally within a corresponding one of focus openings 74A. Accordingly, focusing structure 72 is arranged in a waffle-like pattern in the active area. In the row direction, active-area portions of structure 72 overlie portions of protective layer 70 that occupy (a) the spaces between main control electrodes 46A and (b) the additional spaces between dummy electrodes 46B and the first and last of main control electrodes 46A. In the column direction, focusing structure 72 typically passes over main control electrodes 46A outside control apertures 48. A column of generally rectangular dummy focus openings 74B, one for each emitter row electrode 42A, extend through structure 72 down to the dummy electrode 46B at each column-direction edge of the active area.

In the peripheral device area, base focusing structure 72 is situated on the portion of protective layer 70 extending into the space between the illustrated dummy electrode 46B and additional conductor 46C. The right-hand edge of the illustrated dummy electrode 46B is shown in FIG. 2*f* as being in approximate vertical alignment with the sidewall of a peripheral-area part of focusing structure 72. Alternatively, structure 72 can partially overlie the illustrated dummy electrode 46B along its right-hand edge or can be spaced laterally apart from the right-hand edge of the illustrated dummy electrode 46B.

One or more additional generally rectangular openings 74C extend through base focusing structure 72 down to additional conductor 46C. When there is only one such additional opening 74C, it typically extends across all of emitter row electrodes 42A or, if emitter electrodes 42A terminate below the space between conductors 46B and 46C, beyond the ends of all of electrodes 42A. When there are multiple additional openings 74C, each opening 74C normally extends across at least two (but not all) of emitter electrodes 42A or, if electrodes 42A terminate below the space between conductors 46B and 46B, beyond the ends of two or more (but not all) of electrodes 42A.

Part of base focusing structure 72 extends down to dielectric layer 44A in the space between protective layer 70 and additional conductor 46C. Focusing structure 72 partially overlies additional conductor 46C along its left-hand edge in the example of FIG. 2*g*. Alternatively, structure 72 can have a peripheral-area sidewall in approximate vertical alignment with the left-hand edge of additional conductor 46C. Structure 72 can also be spaced apart from conductor 46C.

Base focusing structure 72 normally consists of electrically insulating material. Typically, focusing structure 72 is formed with actinic material that has been selectively exposed to suitable actinic radiation and developed to remove either the exposed or unexposed actinic material. Exposure to the actinic radiation causes the exposed actinic material to change chemical structure. The actinic material is typically positive-tone photopolymerizable polyimide such as Olin OCG7020 polyimide. Focusing structure 72 typically extends 45–50 $\mu$m above insulating layer 44A.

Various techniques can be employed to form base focusing structure 72. In a typical process sequence for creating focusing structure 72, a blanket layer of positive-tone polymerizable polyimide is deposited on top of the partially finished field emitter. The polyimide is spun to produce a relatively flat upper polyimide surface. The flattened polyimide is baked. Using a suitable photomask situated above the field emitter and having a radiation-transmissive area at the desired location for structure 72, the polyimide is exposed to frontside actinic radiation, typically UV light, that impinges on top of the structure and causes the exposed polyimide to polymerize (crosslink). The unexposed polyimide is removed with a suitable developer. The remaining (i.e., exposed) polyimide is cured at elevated temperature in a non-reactive environment, thereby producing structure 72.

When the polyimide is Olin OCG7020 polyimide, the pre-development baking step is typically performed for 20 min. at approximately 95° C. The developer is Olin QZ3501 development solution. The post-development cure is typically performed at 350° C. for 2 hr. in nitrogen and then at 425° C. for 1 hr. in a vacuum of $10^{-5}$ torr or lower.

Alternatively, base focusing structure 72 can be formed according to the backside/frontside actinic-radiation exposure procedure described in U.S. Pat. Nos. 5,649,847 or 5,650,690. Alternatively, structure 72 can be created according to the backside/frontside actinic-radiation procedure disclosed in Spindt et al, U.S. patent application Ser. No. 08/866,150, filed May 30, 1997. In the latter case, emitter electrodes 42A in non-insulating region 42 are typically in the shape of ladders as viewed perpendicularly to the upper surface of baseplate 40. Regardless of how structure 72 is formed, protective layer 70 prevents the materials employed in forming structure 72 from penetrating excess emitter-material islands 56C and contaminating or otherwise damaging electron-emissive elements 56A.

Using base focusing structure 72 as an etch shield, the unshielded parts of protective layer 70 are removed with an etchant having a substantial isotropic component. See FIG. 2*g*. The etchant undercuts focusing structure 72 to produce (a) a two-dimensional array of rows and columns of gaps 76A and (b) a column of dummy gaps 76B at each column-direction edge of the active area. Each gap 76A extends in an annular manner around the bottom of a different one of focus openings 74A. Similarly, each dummy gap 76B extends in an annular manner around the bottom of a different one of dummy focusing openings 74B. Each gap 76A corresponds to gap 30 in the process sequence of FIG. 1. Alternatively, each dummy gap 76B (e.g., the illustrated one) along the illustrated dummy electrode 46B can correspond to gap 30.

The etchant utilized to create gaps 74A and 74B is usually a liquid chemical etchant. When protective layer 70 consists of silicon oxide, the etchant typically consists of 50% acetic acid, 30% water, and 20% ammonium fluoride by weight. The etch is typically performed for 3 min. at 20° C. Alternatively, a plasma etchant having a substantial isotropic component can be used.

Figure 2G:
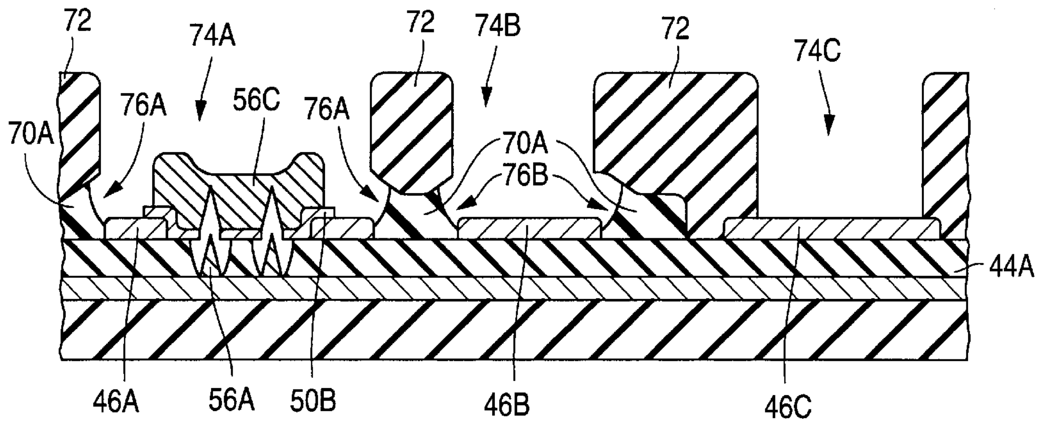

The remainder of protective layer 70 is indicated as item 70A in FIG. 2*g*. The portions of remaining protective layer 70A shown in FIG. 2*g* are connected together outside the plane of the figure. Remaining protective layer 70A underlies base focusing structure 72 and effectively forms part of the electron focusing system.

An electrically non-insulating focus coating material is physically vapor deposited on top of the structure to form (a) a continuous focus coating segment 78A, (b) a two-dimensional array of rows and columns of extra coating segments 78B, and (c) a column of extra dummy coating segments 78C at each column-direction edge of the active area. See FIG. 2*h*. Focus coating segment 78A, which corresponds to second coating segment 32B in the process sequence of FIG. 1, is situated on top of base focusing structure 72 and extends down its sidewalls into openings 74A–74C. Focus coating 78A contacts substantially the entire portion of additional conductor 46C at the bottom of each additional opening 74C. The portions of focus coating 78A shown in FIG. 1*h* are connected together outside the plane of the figure.

Each extra coating segment 78B lies on one of excess emitter-material islands 56C in corresponding focus opening 74A and extends over the uncovered parts of gate portion 50B and main control electrode 46A in that focus opening 74A. Part of gap 76A in each focus opening 74A separates coating segments 78A and 78B in that opening 74A. Each extra dummy coating segment 78C is situated on dummy electrode 46B in one of dummy focus openings 74B. Part of gap 76B in each dummy opening 74B separates coating segments 78A and 78C in that opening 74B. Each coating segment 78B corresponds to first coating segment 32A in the process sequence of FIG. 1. Alternatively, each dummy coating segment 78C can correspond to first coating segment 32A.

Electrically non-insulating coating segments 78A–78C normally consist of electrically conductive material, typically metal such as nickel. In certain applications, coating segments 78A–78C can be formed with electrically resistive material. In any event, the resistivity of focus coating segment 78A is normally considerably less than the resistivity of base focusing structure 72. Also, the thickness of coating segments 78A–78C is typically less than the thickness of remaining protective layer 70A. When protective layer 70A is 0.5 $\mu$m thick, coating segments 78A–78C are typically 0.1 $\mu$m thick.

Figure 4A:
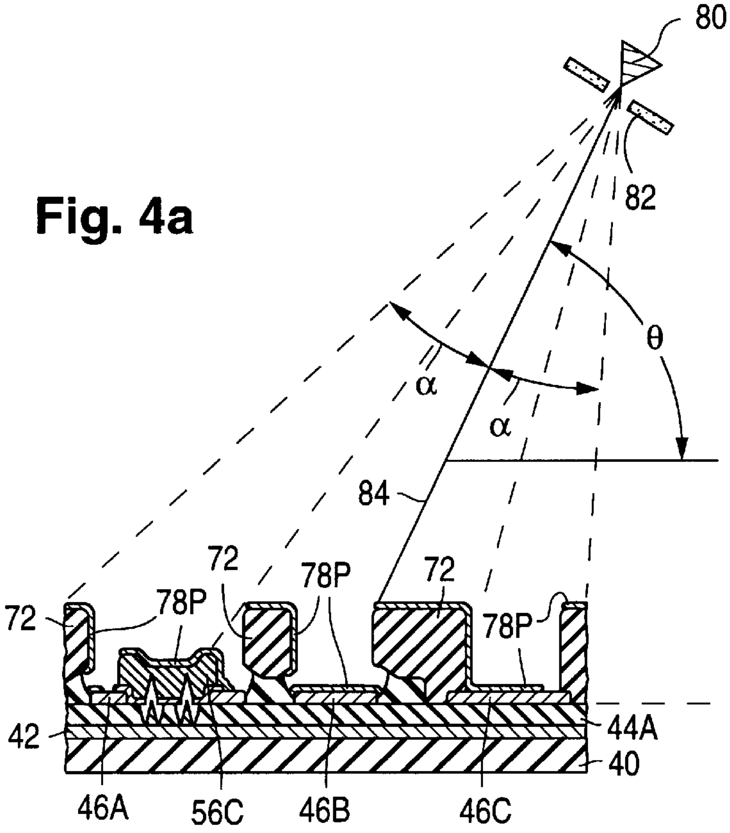
FIGS. 4*a* and 4*b* are simplified cross-sectional structural views illustrating angled rotational deposition of focus coating material on the partially finished field emitter of FIG. 2*g*.
Figure 4B:
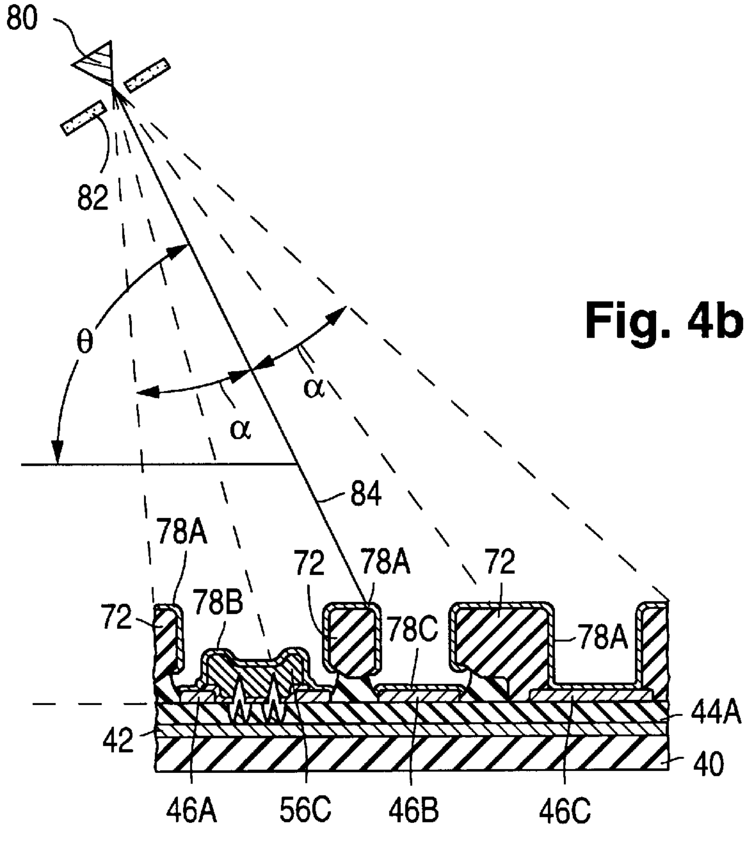

FIGS. 4*a* and 4*b* qualitatively illustrate an example of how the deposition of coating segments 78A–78C is performed. FIG. 4*a* represents a point close to the beginning of the deposition. Items 78P in FIG. 4*a* denote initial portions of the focus coating material. FIG. 4*b* represents a point close to the end of the deposition.

The deposition technique illustrated in FIGS. 4*a* and 4*b* (collectively "FIG. 4") generally represents evaporative deposition with a restriction on the angular range of the particles of material impinging on the partially finished field emitter, but can represent sputtering with the angular particle range similarly restricted. Item 80 in FIG. 4 schematically represents the source of the coating material. Item 82 represents an optional plate having an aperture through which the coating material impinges on the partially finished field emitter.

During the deposition, composite deposition source 80/82 and the partially finished field-emitter are typically translated relative to each other in a plane parallel to the upper surface of baseplate 40. When the deposition is performed with angular restriction on the deposition angle as often occurs in evaporation, deposition source 80/82 and the field emitter are typically rotated, relative to each other, about an axis approximately perpendicular to the upper surface of baseplate 40. The field emitter is typically rotated while deposition source 80/82 is stationary. However, deposition source 80/82 can be rotated while the field emitter is stationary. Also, deposition source 80/82 and the field emitter can both be rotated.

The coating material impinges on the field emitter in a line-of-sight manner at a principal incidence angle $\theta$ as indicated in FIGS. 4*a* and 4*b*. The impinging coating material has a central axis 84 that forms the principal deposition axis. Principal incidence angle $\theta$, measured from principal deposition axis 84 to a plane extending parallel to the upper surface of baseplate 40, is 20–90°, typically 90° for sputtering and 60° for evaporation. When the deposition is controlled so as to restrict the angular range of the impinging coating material, the particles of the coating material impinge on the field emitter in a roughly conical manner characterized by a half angle $\alpha$ measured from principal deposition axis 84. Half angle $\alpha$ is 5–45°, typically 20°.

By depositing the focus coating material in the preceding manner, portions of the upper surface of the field emitter at gaps 76A and 76B are shadowed from the impinging coating material. The coating material normally moves little after accumulating on the upper surface of the field emitter. The presence of gaps 76A and 76B prevents focus coating segments 78A from respectively bridging to coating segments 78B and 78C. Accordingly, focus coating 78A is spaced apart from all of coating segments 78B and 78C.

Excess emitter-material islands 56C and at least the overlying portions of coating segments 78B are removed. Each of coating segments 78B can be entirely removed. If so, each of coating segments 78C is also typically entirely removed. FIGS. 2*i* and 3*b* depict the resultant structure for the case in which coating segments 78B and 78C are fully removed.

The removal of excess emitter-material islands 56C and at least the overlying portions of coating segments 78B can be performed in various ways. Coating segments 78B are typically removed electrochemically by immersing the partially finished field emitter in a suitable electrolytic bath. The electrochemical removal operation is conducted in such a way that coating segments 78B are arranged to be positive in potential relative to focus coating segment 78A and electron-emissive cones 56A. As a result, coating segments 78B are dissolved in the electrolytic bath without dissolving focus coating 78A and without dissolving or otherwise damaging cones 56A. Coating segments 78C are simultaneously removed by applying the same potential to segments 78C as applied to segments 78B. Subsequently, excess islands 56C are electrochemically removed, typically according to a technique of the type disclose in Knall et al, U.S. patent application Ser. No. 08/884,700, filed Jun. 30, 1997.

If coating segments 78B are porous to the electrolytic bath, excess emitter-material islands 56C can be electrochemically removed without the necessity to perform a separate operation for removing the overlying parts of segments 78B. Specifically, as the electrolytic bath penetrates through coating segments 78B, excess island 56C are electrochemically removed, again typically according to a technique such as that described in Knall et al, Ser. No. 08/884,700, cited above. During the removal of excess islands 56C, the overlying portions of segments 78B are lifted off and carried away in the electrolytic bath. The electrolytic bath can be stirred, or otherwise agitated, to help remove the lifted-off portions of segments 78B from the vicinity of the field emitter. In this removal technique, coating segments 78C and the portions of coating segments 78B overlying main control electrodes 46A are present at the end of the removal operation, and are typically present in the final field emitter.

As a further alternative, excess emitter-material islands 56C and at least the overlying portions of coating segments 78B can be removed according to a lift-off technique if the lift-off etchant can penetrate segments 78B. In this case, a lift-off layer is provided on top of gate layer 50A at the stage shown in FIG. 2*b*. The lift-off layer is typically created by evaporating a suitable lift-off material at a relatively small angle, typically in the vicinity of 30°, to the upper surface of baseplate 40. The lift-off material is subsequently patterned in largely the same way as excess emitter-material layer 56B.

Figure 2H:
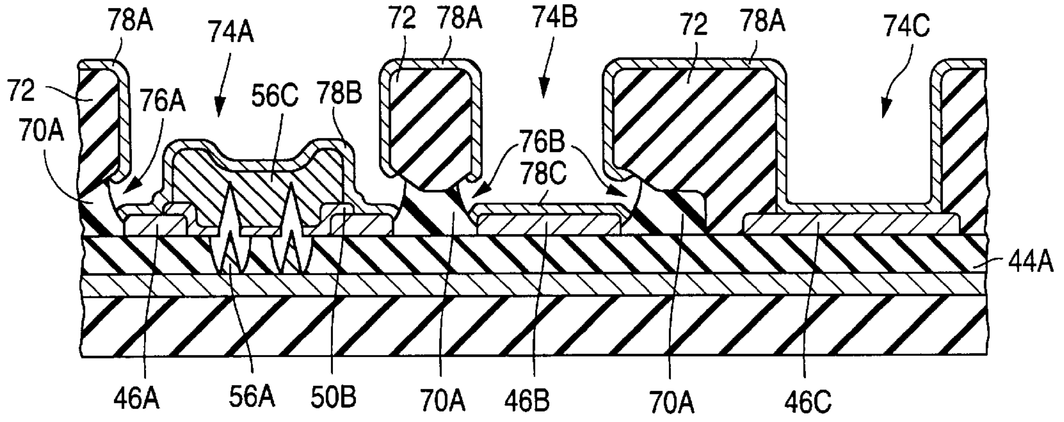
Figure 2I:
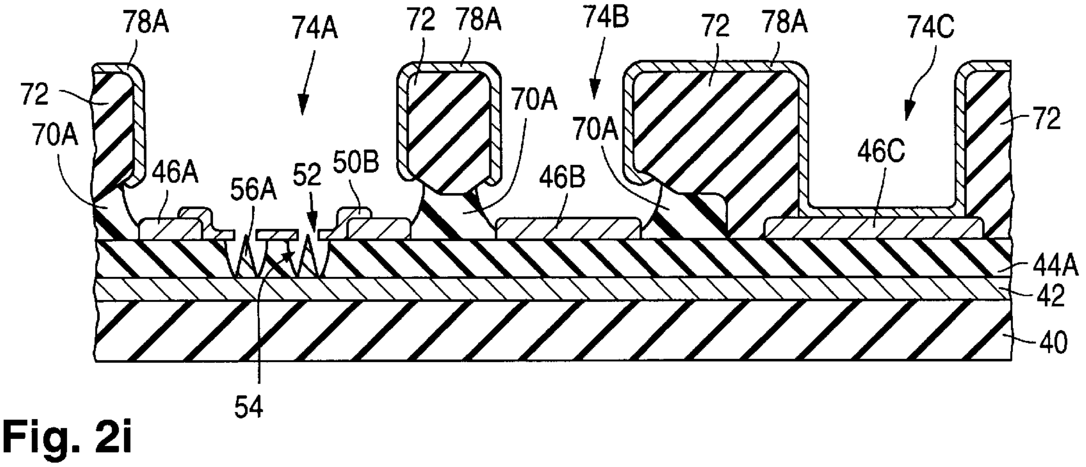

At the stage shown in FIG. 2*h*, an island of the lift-off material lies between each excess emitter-material island 56C and underlying gate portion 50B. A suitable etchant is employed to remove the lift-off islands. Excess islands 56C are thereby lifted off i.e., removed, and carried away in the etchant. If islands 56C are porous to the etchant used in lifting them off, advantage can be taken of this porosity to let the lift-off etchant penetrate islands 56C vertically and rapidly attack the underlying lift-off islands along their entire upper surfaces. The lift-off operation is then performed in a relatively short time. Again, coating segments 78C and the portions of segments 78B situated on main control electrodes 46A are present at the end of the removal operation.

Focus coating 78A, base focusing structure 72, and protective layer 70A, which totally underlies structure 72, form the electron focusing system. An external focus control potential is applied to additional conductor 46C directly, or by way of an intermediate electrical conductor (not shown) connected to conductor 46C. By virtue of the ohmic connection between conductor 46C and focus coating 78A, the focus control potential is applied to coating 78A for controlling the focusing of electrons emitted by electron-emissive cones 56A during device operation.

The flat-panel CRT display is typically a color display in which each pixel consists of three sub-pixels, one for red, another for green, and the third for blue. Typically, each pixel is approximately square as viewed perpendicularly to the upper surface of baseplate 40, the three sub-pixels being laid out as rectangles situated side by side in the row direction with the long axes of the rectangles oriented in the column direction. In this sub-pixel layout, electron focus control is normally more critical in the row direction than in the column direction.

The sets of electron-emissive elements 56A in each control aperture 48 provide electrons for one sub-pixel. The control apertures 48 in each composite control electrode 46A/50B are arranged to be centered on that electrode 46A/50B in the row direction. By arranging for edges of electron focusing system 70A/72/78A to be approximately aligned vertically with the longitudinal edges of composite control electrodes 46A/50B in the manner depicted in FIGS. 2*i* and 3*b*, excellent focus control is achieved in the row direction.

FIGS. 5*a*–5*d* (collectively "FIG. 5") illustrate a variation of the process of FIG. 2 for manufacturing a gated field emitter of a flat-panel CRT display. In the variation of FIG. 5, deposition of focus coating material directly on the top surfaces of excess emitter-material islands 56C is avoided by arranging for focus coating segments to accumulate on other regions provided above excess islands 56C in accordance with the invention. The process of FIG. 5 follows that of FIG. 2 through the stage of FIG. 2*e*.

Base focusing structure 72 in the process of FIG. 5 is created from positive-tone photopatternable polyimide according to the frontside exposure technique described above for the process of FIG. 2 subject to one major difference. In addition to having a radiation-transmissive area at the desired location for focusing structure 72, the photomask situated above the partially finished field emitter has a two-dimensional array of additional radiation-transmissive areas situated generally above the portions of protective layer 70 overlying excessive emitter-material islands 56C. Portions 72A of the polyimide below these additional radiation-transmissive areas are thus exposed to the frontside actinic radiation and undergo polymerization.

Figure 5A:
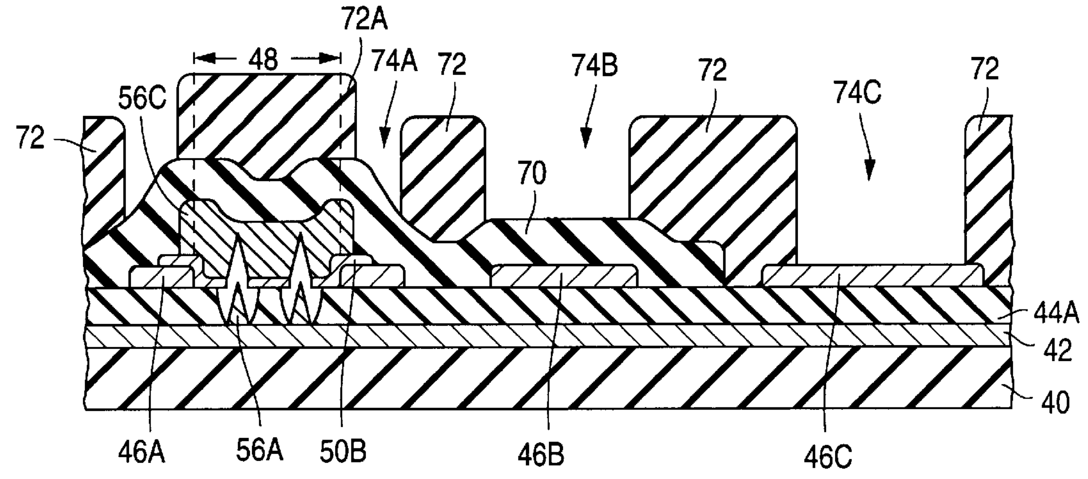
FIGS. 5*a*–5*d* are cross-sectional structure views representing steps substituted for the steps of FIGS. 2*f*–2*i* in manufacturing another field emitter according to the invention.

FIG. 5*a* depicts the structure after developing the blanket polyimide layer to remove the unexposed polyimide and performing the post-development cure on the remaining (exposed) polyimide. Each polyimide portion 72A is an electrically insulating island situated on protective layer 70 above corresponding excess emitter-material island 56C. Insulating islands 72A are roughly centered vertically on underlying excess islands 56C. Each insulating islands 72A can be of lesser, or slightly greater, dimension than underlying excess island 56C in both the row direction and the column direction. FIG. 5*a* illustrates the situation in which the row-direction dimension of each insulating island 72A slightly exceeds that of underlying excess island 56C.

Insulating islands 72A extend significantly above base focusing structure 72. In particular, both focusing structure 72 and insulating islands 72A shrink during the post-development cure of the polyimide. The percentage volume shrinkages of structure 72 and island 72A are of similar magnitude. However, focusing structure 72 is of considerably greater lateral extent than each of insulating islands 72A. The greater lateral extent of structure 72 acts to limit its lateral shrinkage relative to the lateral shrinkage of each island 72A. As structure 72 and island 72A attempt to reach approximately the same volume percentage shrinkage, structure 72 thus shrinks more in the vertical direction than each island 72A.

More specifically, the portions of base focusing structure 72 shown in FIG. 5*a* are column-direction strips of considerably greater column-direction dimension than insulating islands 72A. This significantly inhibits the shrinkage of the illustrated portions of focusing structure 72 in the column direction relative to that of islands 72A in the column direction. Consequently, the illustrated portions of structure 72 shrink more percentage-wise in the row direction and in the vertical direction than islands 72A. Similarly, the strips of structure 72 extending in the row direction are of considerably greater row-direction dimension than islands 72A. The row-direction strips of structure 72 are thus significantly inhibited from shrinking in the row direction and shrink more percentage-wise in the column direction and in the vertical direction than islands 72A. The net result of the shrinkage differences is that insulating islands 72A extend significantly above focusing structure 72. This is qualitatively illustrated in FIG. 5*a*.

Figure 5B:
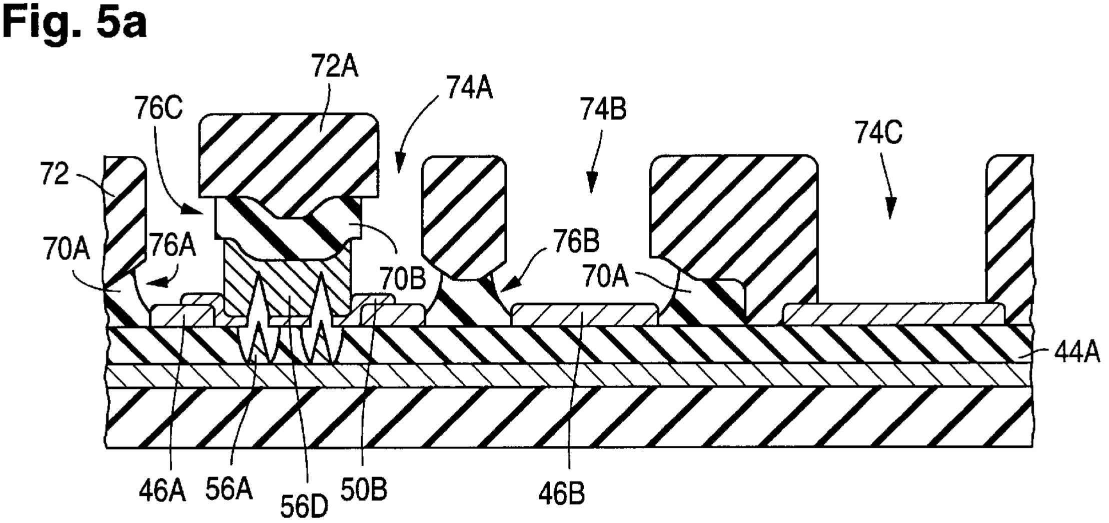

Using the combination of base focusing structure 72 and insulating islands 72A as an etch shield, the unshielded portions of protective layer 70 are removed with an etchant having a substantial isotropic component. Focusing structure 72 is again undercut by gaps 76A and 76B as shown in FIG. 5*b*. In addition, the etchant undercuts insulating islands 72A to produce a two-dimensional array of rows and columns of further gaps 76C respectively below insulating islands 72A. If each insulating island 72A is of greater dimension in the row or column direction than underlying excess emitter-material island 56C, each further gap 76C includes the space by which corresponding insulating island 72A overlaps corresponding excess island 56C.

The remaining portions of protective layer 70 below insulating islands 72A consist of a two-dimensional array of rows and columns of protective islands 70B. Each protective island 70B is roughly centered vertically on overlying insulating island 72A and on underlying excess emitter-material island 56C.

When excess emitter-material islands 56C are of greater dimension in the row or column direction than overlying protective islands 70B, a further etch is typically conducted to remove the material of excess islands 56C that extends laterally beyond protective islands 70B. Further gaps 76C are thereby expanded to include the spaces where the material of excess islands 56C is removed. Items 56D in FIG. 5*b* indicate the remaining portions of excess islands 56C. The further etch is typically performed long enough so that remaining excess emitter-material islands 56D slightly undercut protective islands 70B. The combination of protective islands 70B and insulating islands 72A serves as an etch shield during the further etch, the etchant having a substantial isotropic component.

An electrically non-insulating focus coating material is deposited on top of the structure in the line-of-sight manner described above. See FIG. 5*c*. Focus coating segment 78A again accumulates on the top and side surfaces of base focusing structure 72, and extends down to additional conductor 46C in each additional opening 74C. Extra coating segments 78C similarly accumulate on the tops of dummy electrodes 46B in dummy focus openings 74B.

In addition, extra coating segments 78D accumulate on the top and side surfaces of insulating islands 72A. Corresponding extra coating segments 78E accumulate on the uncovered parts of the adjoining gate portions 50B and main control electrodes 46A. Part of each gap 76C separates overlying coating segment 78D from underlying coating segment 78E. Coating segments 78A and 78C–78E are all spaced apart from one another.

Coating segments 78D, insulating islands 72A, protective islands 70B, and excess emitter-material islands 56D are now removed. FIG. 5*d* depicts the resulting structure. Coating segments 78C normally remain after the removal step. Protective layer 70A again underlies base focusing structure 72 and effectively forms part of the electron focusing system in combination with structure 72 and focus coating 78A.

The removal of regions 78D, 72A, 70B, and 56D can be performed in various ways. Since the island top formed by each insulating island 72A and the adjoining coating segment 78D extends above electron focusing system 70A/72/78A, mechanical force can be exerted on island tops 72A/78D to remove them from the partially finished field emitter. For example, a jet of gas or liquid can be directed towards island tops 72A/78D to cause them to separate from the field emitter. In such a case, the characteristics of the field-emission structure are chosen so that focusing system 70A/72/78 is capable of withstanding considerably higher lateral shearing stress than island tops 72A/78D. By appropriately controlling the force exerted by the fluid jet, focusing system 70A/72/78A remains in place and is not damaged as island tops 72A/78D are removed. Alternatively, tape of suitable adhesive characteristics can be placed across the top of the structure so as to adhere to island tops 72A/78D. The adhesive tape is then pulled away from the field emitter to remove island tops 72A/78D.

The separation between island tops 72A/78D and the underlying material can occur at various locations below island tops 72A/78D. When island tops 72A/78D are removed by mechanically exerting force on them, the characteristics of the field emitter can be chosen so that the weakest structural areas for the composite islands formed with regions 78D, 72A, 70B, and 56D occur along the interfaces between islands 56D and underlying gate portions 50B. Exerting mechanical force on island tops 72A/78D then causes each combination of coating segment 78D, insulating island 72A, protective island 70B, and excess island 56D to separate from the field emitter along the interface between that excess island 56D and underlying gate portion 50B, and thereby be removed from the partially finished structure.

Alternatively, the islands formed by regions 78D, 72A, 70B, and 56D may separate from the field emitter at locations above gate portions 50B but below insulating islands 72A. In this case, any remaining parts of protective islands 70B can be removed with a suitable etchant. All of the remaining material of excess islands 56D is electrochemically removed according to a technique such as that disclosed in Knall et al, Ser. No. 08/884,700, cited above.

In another alternative, the removal of regions 78D, 72A, 70B, and 56D is initiated by removing protective islands 70B with a suitable liquid chemical etchant. Island tops 72A/78D are thereby lifted off and carried away in the etchant. Excess islands 56D are electrochemically removed as described in the preceding paragraph.

As a further alternative, excess emitter-material islands 56C can be electrochemically removed by etching them from the side without earlier removal of any of the material overlying excess islands 56C. Regions 78D, 72A, and 70B are lifted off as islands 56C are etched away.

Figure 5C:
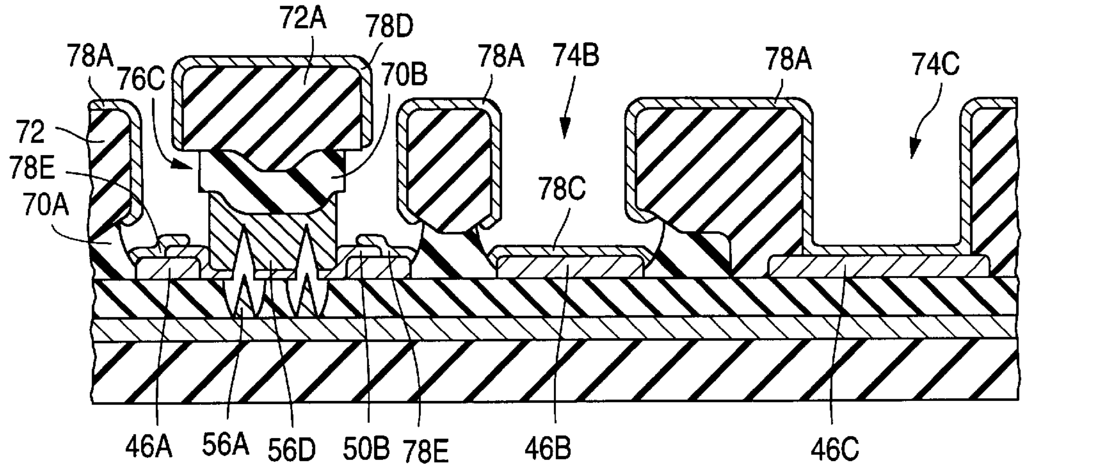
Figure 5D:
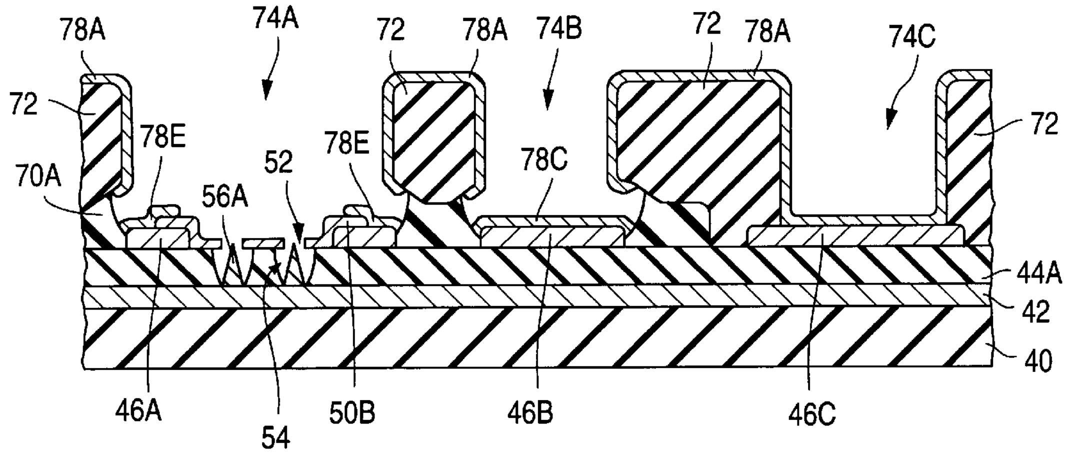
Figure 6A:
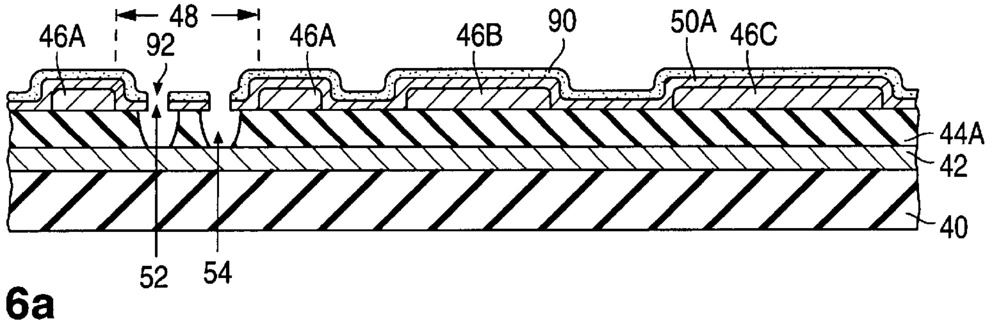
FIGS. 6*a* and 6*b* are cross-sectional structural views representing steps substituted for the steps of FIGS. 2*b* and 5*c* in manufacturing a further field emitter according to the invention.
Figure 6B:
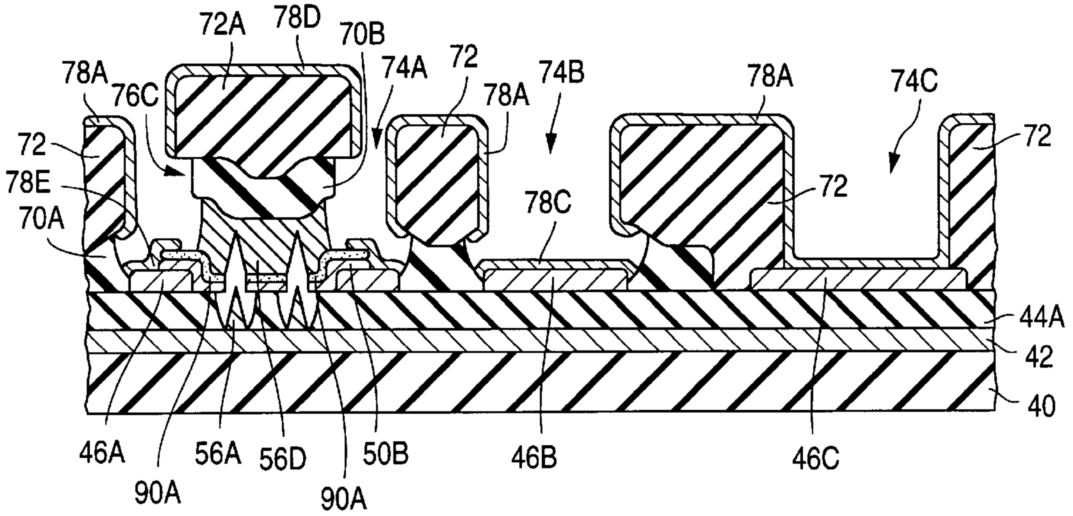

FIGS. 6*a* and 6*b* (collectively "FIG. 6") illustrate a variation of the process of FIG. 5 in which a parting layer is provided over gate layer 50B to facilitate the removal of regions 78D, 72A, 70B, and 56D. The process of FIG. 6 follows the process of FIGS. 2 and 5 up through the stage of FIG. 2*b*. A parting layer 90 is then formed on top of gate layer 50A as shown in FIG. 6*a*. Similar to the lift-off layer described above, parting layer 90 is typically created by evaporating a suitable parting material on top of the structure at a relatively small angle, typically in the vicinity of 30°, to the upper surface of baseplate 40. Parting openings 92 extend through parting layer 90 respectively above gate openings 52.

Subsequent processing operations are performed in the manner described above for the process of FIGS. 2 and 5 up through the stage of FIG. 5*c* subject to patterning parting layer 90 in largely the same way as excess emitter-material layer 56B. FIG. 6*b* illustrates the structure at this point. Item 90A in FIG. 6*b* indicates the resulting patterned portion of parting layer 90 in each focus opening 74A.

Coating segments 78D, insulating islands 72A, protective islands 70B, and excess islands 56D are subsequently removed from the structure of FIG. 6*b*. This can be done in various ways to produce the structure of FIG. 5*d*.

Parting-layer portions 90A can be chosen so that they adhere weakly to gate portions 50B relative to how overlying regions 78D, 72A, 70B, and 56D variously adhere to one another. Mechanical force is exerted on island tops 72A/78D in the manner described above, causing regions 78D, 72A, 70B, and 56D to separate from the field emitter along parting-layer portions 90A. If desired, any remaining material of parting-layer portions 90A can be removed with a suitable etchant.

Alternatively, parting-layer portions 90A can be removed with a suitable etchant. The removal of parting-layer portions 90A can be accelerated by arranging for excess-emitter material islands 56D to be of such characteristics that the etchant penetrates excess islands 56D and attacks the underlying material of portions 90A. Regions 78D, 72A, 70B, and 56D are lifted off as parting-layer portions 90A are removed.

The removal of regions 78D, 72A, 70B, and 56D can also be initiated by removing protective islands 70B with a suitable liquid chemical etchant. Island tops 72A/78D are thereby lifted off and carried away in the etchant. Parting-layer portions 90A are subsequently removed to lift-off excess islands 56D.

The correspondence analogies made between the process of FIG. 2 and the process sequence of FIG. 1 carry over to the process variations of FIGS. 5 and 6 with respect to the process of FIG. 1. That is, each main control electrode 46A (or each composite control electrode 46A/50B), additional conductor 46C, protective layer 70, base focusing structure 72, each gap 76A, each coating segment 78B, and focus coating 78A in the process of FIG. 5 respectively correspond to primary component 22, further component 24, first region 26, second region 28, gap 30, first coating segment 32A, and second coating segment 32B in the process sequence of FIG. 1. The same applies to the process of FIG. 6 relative to the process sequence of FIG. 1.

Inasmuch as additional undercuts occur in the process variations of FIGS. 5 and 6, alternative correspondence analogies exist between the process variation of FIG. 5 or 6 and the process sequence of FIG. 1. For example, each main control electrode 46A (or each composite control electrode 46A/50B), protective layer 70, each insulating island 72A, each gap 76C, each coating segment 78E, and each coating segment 78D in the process variation of FIG. 5 respectively correspond to primary component 22, first region 26, second region 28, gap 30, first coating segment 32A, and second coating segment 32B in the process sequence of FIG. 1. The same applies to the process variation of FIG. 6 relative to the process sequence of FIG. 1. Each excess emitter-material island 56C may be combined with protective layer 70 and viewed as corresponding to part of first region 26. Alternatively, each excess island 56C may be combined with adjoining main control electrode 46A (or adjoining composite control electrode 46A/50B) so as to correspond to part of primary component 22.

FIGS. 7*a*–7*g* (collectively "FIG. 7") illustrate another process for manufacturing a gated field emitter of a flat-panel CRT display in accordance with the invention. The coating segmentation principles utilized in the process sequence of FIG. 1 are followed in the process of FIG. 7 in creating a focus coating of an electron focusing system. As mentioned above, first region 26 in the process sequence of FIG. 1 can be implemented with electrically conductive material rather than electrically insulating material (as occurs in the processes of FIGS. 2, 5, and 6). This variation occurs in the process of FIG. 7 with the region corresponding to first region 26.

The process of FIG. 7 follows the process of FIG. 2 up through the stage of FIG. 2*a*. Gate openings 52 are created through gate layer 50. See FIG. 7*a*. Using a suitable photoresist mask (not shown), the remainder of gate layer 50 is patterned to produce gate portions 50C. One or more of gate portions 50C overlie each main control electrode 46A and extend into control apertures 48 in that electrode 46A. After forming gate portions 50C, a further dielectric layer 100 is deposited on top of the structure.

Using another photoresist mask (not shown), generally rectangular openings 102 concentric with, but slightly larger than, control apertures 48 are etched through further dielectric layer 100. See FIG. 7*b*. The portion of dielectric layer 100 above additional conductor 46C is also removed during the etch. Item 100A in FIG. 7*b* indicates the patterned remainder of dielectric layer 100. Patterned dielectric layer 100A or/and underlying main control electrode 46A correspond to primary component 22 in the process of FIG. 1. Dielectric openings 54 are then etched through dielectric layer 44. Item 44A again indicates the remainder of dielectric layer 44.

A parting layer 104 is deposited on top of the structure. Parting layer 104 is created in the manner described above for parting layer 90 in the process of FIG. 6. Parting-layer openings 106 extend through parting layer 104 above gate openings 52.

Conical electron-emissive elements 108A are formed in composite openings 52/54 by evaporatively depositing an electrically non-insulating emitter cone material in the manner described above for the process of FIG. 2. See FIG. 7*c*. A blanket excess layer of the emitter cone material simultaneously accumulates on top of the structure.

Using a photoresist mask (not shown), the excess emitter-material layer is patterned to produce a two-dimensional array of rows and columns of generally rectangular excess emitter-material islands 108B respectively above further dielectric openings 102. Each excess emitter-material island 108B, which corresponds to first region 26 in the process of FIG. 1, typically extends slightly above further dielectric layer 100A. Also, a column of dummy excess emitter-material islands 108C may be produced above dummy electrodes 46B at each column-direction edge of the active area. Parting layer 104 is patterned in largely the same way as the excess emitter-material layer. Items 104A and 104B in FIG. 7*c* indicate the remaining portions of parting layer 104.

Figures 7A, 7B, 7C, 7D:
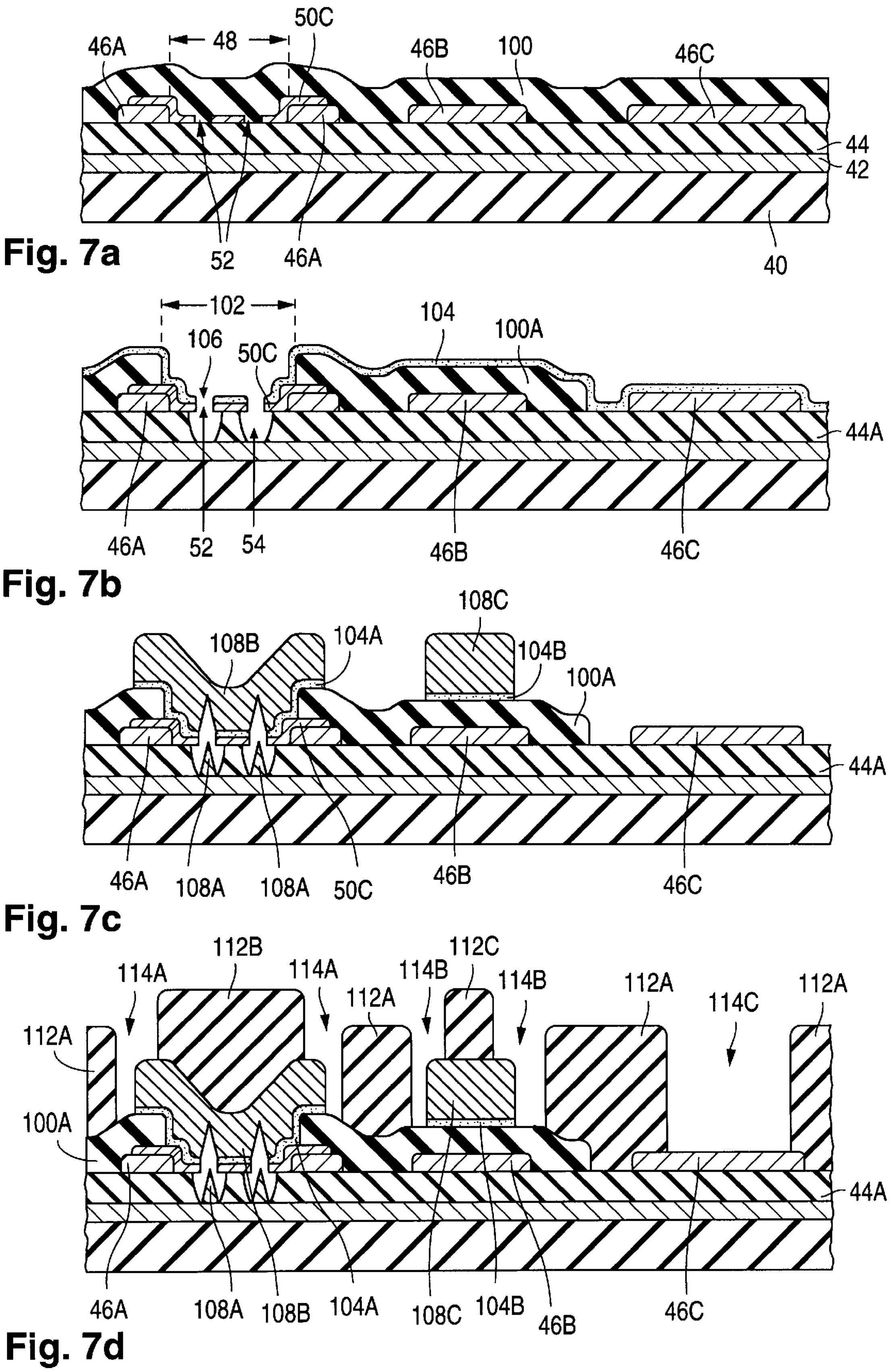
FIGS. 7*a*–7*g* are cross-sectional structural views representing steps in manufacturing yet another gated field emitter according to the invention.
Figure 7E:
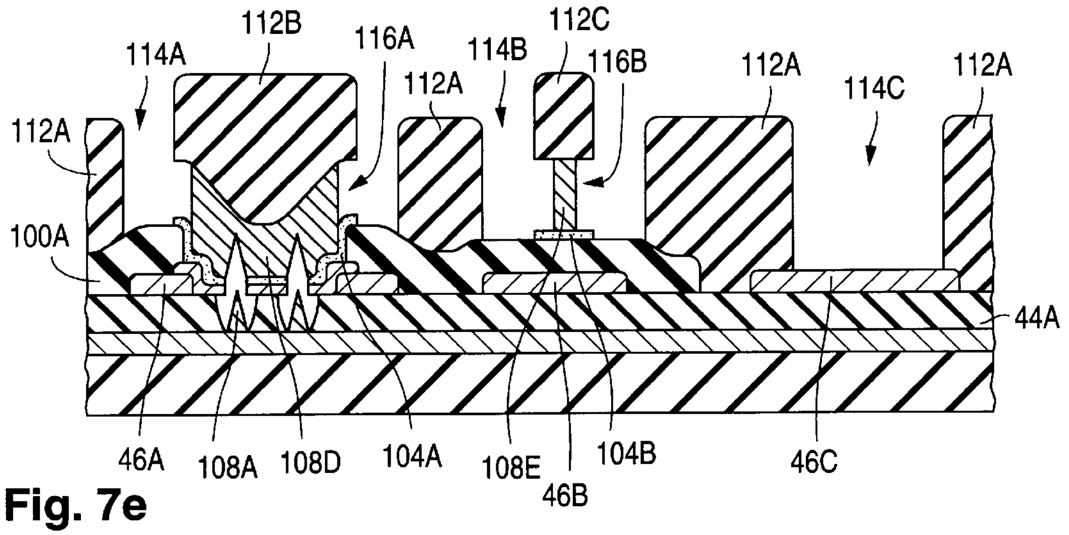
Figure 7F:
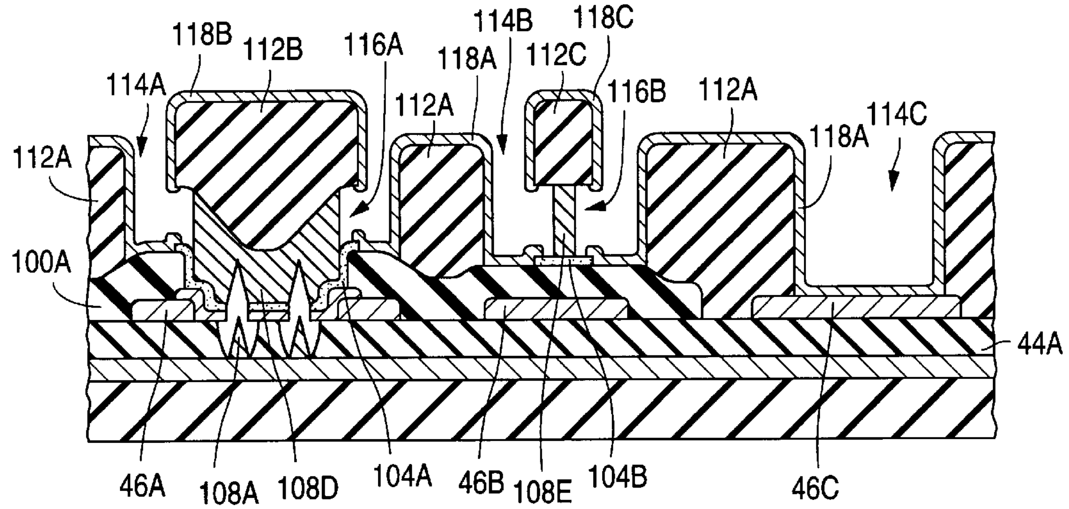

An electrically non-conductive base focusing structure 112A for the electron-focusing system is formed on top of the partially finished field emitter as shown in FIG. 7*d*. As viewed perpendicularly to the upper surface of baseplate 40, base focusing structure 112A is typically shaped the same as base focusing structure 72 and thus is generally in a waffle-like pattern in the active area. Focus openings 114A, dummy focus openings 114B, and one or more additional openings 114C respectively corresponding to focus opening 74A, dummy focus opening 74B, and the one or more additional openings 74C extend through base focusing structure 112A. Openings 114A–114C are generally rectangular in shape.

In the process of forming base focusing structure 112A, generally rectangular electrically non-conductive islands 112B and 112C are respectively formed on top of excess emitter-material islands 108B and 108C. As viewed perpendicularly to the upper surface of baseplate 40, each non-conductive island 112B or 112C is roughly concentric with, but slightly smaller than, underlying excess island 108B or 108C. Each non-conductive island 112B corresponds to second region 28 in the process of FIG. 1.

Base focusing structure 112A and non-conductive islands 112B and 112C typically consist of electrically insulating material created from positive-tone photopatternable polyimide in the same way as base focusing structure 72 and insulating islands 72A are created in the process variation of FIG. 5 or 6. Even though the upper surface of the unpatterned polyimide layer was relatively flat, the differences in shrinkage during the post-development cure of base focusing structure 112A relative to insulating islands 112B and 112C cause islands 112B and 112C to extend significantly higher than focusing structure 112A.

Using insulating islands 112B and 112C as an etch shield, the unshielded parts of excess islands 108B and 108C are removed with an etchant having a substantial isotropic component. See FIG. 7*e*. The etchant undercuts insulating islands 112B and 112C to respectively produce gaps 116A and 116B. Each gap 116A, which corresponds to gap 30 in the process of FIG. 1, extends in an annular manner around the bottom of a different one of focus openings 114A. Each gap 116B extends in an annular manner around the bottom of a different one of dummy focus openings 114B. The remainders of excess islands 108B and 108C are respectively indicated as items 108D and 108E in FIG. 7*e*.

An electrically non-insulating focus coating is physically deposited on top of the structure to form (a) a continuous focus coating segment 118A, (b) a two-dimensional array of rows and columns of extra coating segments 118B, and (c) a column of extra coating segments 118C near each column-direction edge of the active area. See FIG. 7*f*. Focus coating segment 118A, which corresponds to first coating segment 32A in the process sequence of FIG. 1, is situated on the top and side surfaces of base focusing structure 112A and contacts additional conductor 46C. Focus coating 118A also extends over the exposed portions of further dielectric layer 100A.

Each extra coating segment 118B, which corresponds to second coating segment 32B in the process sequence of FIG. 1, lies on the top and side surfaces of a different one of insulating islands 112B. Part of gap 116A in each focus opening 114A separates coating segments 118A and 118B in that opening 114A. Each extra coating segment 118C is situated on the top and side surfaces of a different one of insulating islands 112C. Part of gap 116B in each dummy focus opening 114B separates coating segments 118A and 118C in that opening 114B. Accordingly, coating segments 118A–118C are all spaced apart from one another.

Figure 7G:
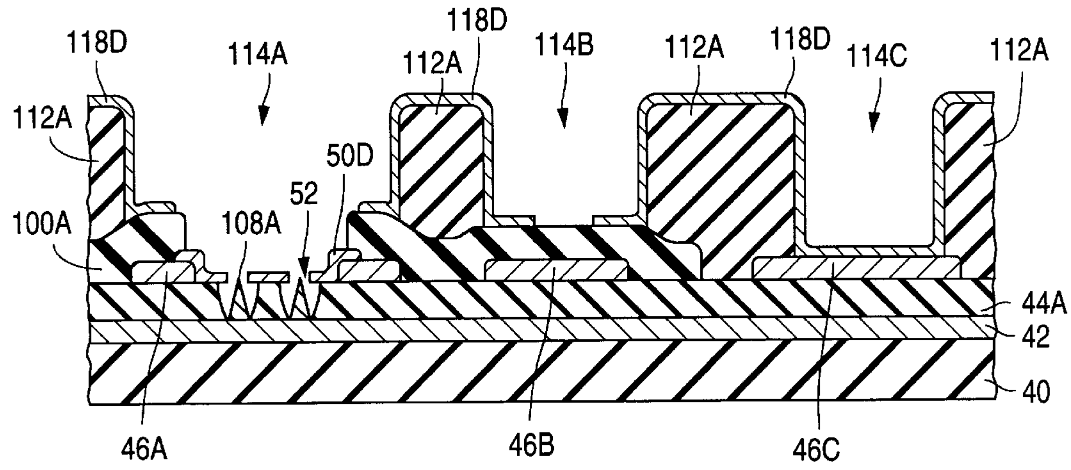

Coating segments 118B and 118C, insulating islands 112B and 112C, excess islands 108D and 108E, and parting-layer portions 104A and 104B are removed to produce the structure shown in FIG. 7*g*. The removal of regions 118B, 118C, 112B, 112C, 108D, 108E, 104A, and 104B can be accomplished in various ways. Since the island tops formed by region pairs 118B and 112B and by region pairs 118C and 112C extend above the region pair 118A and 112A of the electron focusing system, mechanical force can be exerted on region pairs 118B and 112B and on region pairs 118C and 112C to cause regions 118B, 118C, 112B, 112C, 108D, and 108E to break off along parting-layer portions 104A and 104B. As in the process of FIG. 2, the mechanical force can be provided by a fluid jet or by using adhesive tape. Any remainder of parting-layer portions 104A and 104B can be removed with a suitable etchant.

Alternatively, the removal of regions 118B, 118C, 112B, 112C, 108D, 108E, 104A, and 104B can be initiated by removing parting-layer portions 104A and 104B with a suitable etchant. Regions 118B, 118C, 112B, 112C, 108D, and 108E are then lifted off and carried away in the etchant. Regardless of which of these techniques is employed to remove regions 118B, 118C, 112B, 112C, 108D, 108E, 104A, and 104B, any portions of focus coating 118A overlying parting-layer portions 104A and 104B typically break off during the removal of portions 104A and 104B. Items 118D in FIG. 7*d* indicates the remainder of focus coating 118A.

The formation of parting layer 104 can be deleted. In that case, excess emitter-material islands 108D and 108E are electrochemically removed. During the removal of islands 108D and 108E, regions 118B, 118C, 112B, and 112C are lifted off and carried away in the electrolytic bath. The final structure appears substantially the same as shown in FIG. 7*g* except that original focus coating 118A replaces modified focus coating 118D.

In the field emitter fabricated according to the process of FIG. 7, the electron focusing system consists of base focusing structure 112A and focus coating 118D (or 118A). Further dielectric layer 100A, which underlies focusing structure 112A, may be considered part of the electron focusing system. A focus control potential is applied through additional conductor 46C to focus coating 118D (or 118A) to control the focusing of electrons emitted by electron-emissive cones 108A.

Figure 8:
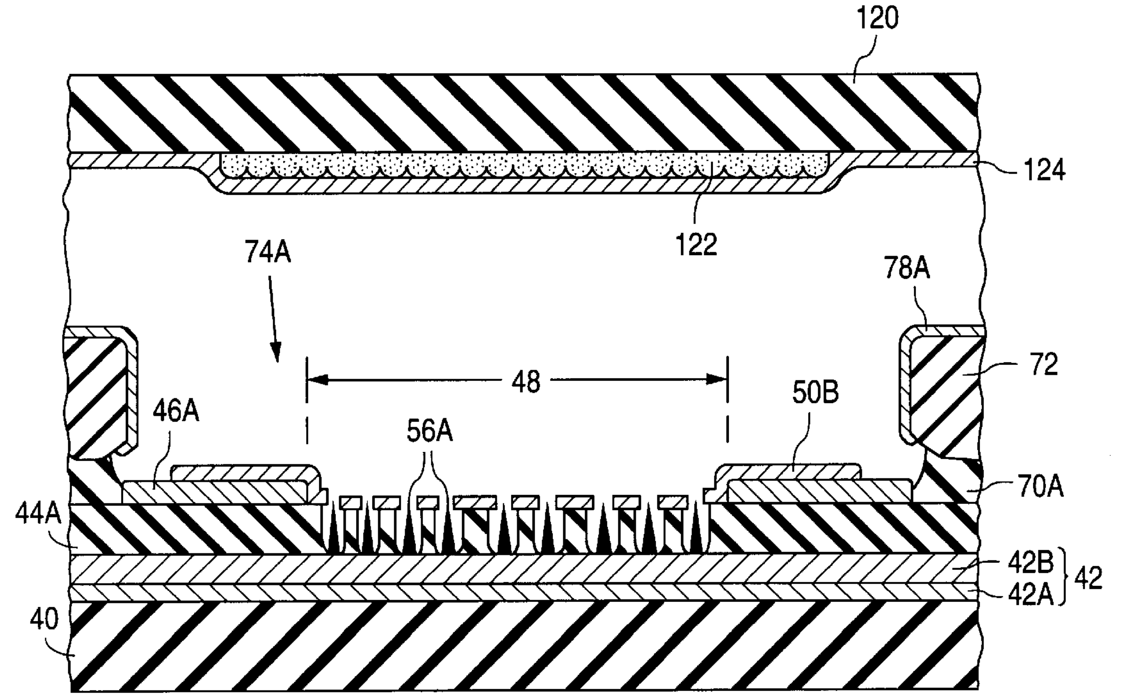
FIG. 8 is a cross-sectional structural view of a flat-panel CRT display that includes a gated field emitter fabricated in accordance with the invention.

FIG. 8 depicts a typical example of the core active region of a flat-panel CRT display that employs an area field emitter, such as that of FIG. 2*i*, manufactured according to the invention. FIG. 8 can also represent the core of a flat-panel CRT display that contains the field emitter of FIG. 5*d* subject to modifying FIG. 8 to include one extra coating segment 78E. Lower non-insulating region 42 here consists specifically of emitter electrodes 42A and an overlying electrically resistive layer 42B. One main control electrode 46A is depicted in FIG. 8.

A transparent, typically glass, largely flat faceplate 120 is located across from baseplate 40. Light-emitting phosphor regions 122, one of which is shown in FIG. 8, are situated on the interior surface of faceplate 120 directly across from corresponding control apertures 48. A thin electrically conductive light-reflective layer 124, typically aluminum, overlies phosphor regions 122 along the interior surface of faceplate 120. Electrons emitted by electron-emissive elements 56A pass through light-reflective layer 124 and cause phosphor regions 122 to emit light that produces an image visible on the exterior surface of faceplate 120.

The core active region of the flat-panel CRT display typically includes other components not shown in FIG. 8. For example, a black matrix situated along the interior surface of faceplate 120 typically surrounds each phosphor region 122 to laterally separate it from other phosphor regions 122. Spacer walls are utilized to maintain a relatively constant spacing between plates 40 and 120.

When incorporated into a flat-panel CRT display of the type illustrated in FIG. 8, a field emitter manufactured according to the invention operates in the following way. Light-reflective layer 124 serves as an anode for the field-emission cathode. The anode is maintained at high positive potential relative to the composite control electrodes 46A/50B and emitter electrodes 42A.

When a suitable potential is applied between (a) a selected one of emitter electrodes 42A and (b) a selected one of control electrodes 46A/50B, the so-selected gate portion 50B extracts electrons from the electron-emissive elements at the intersection of the two selected electrodes and controls the magnitude of the resulting electron current. Upon being hit by the extracted electrons, phosphor regions 122 emit light.

Directional terms such as "top" and "upper" have been employed in describing the present invention to establish a frame of reference by which the reader can more easily understand how the various parts of the invention fit together. In actual practice, the components of an electron-emitting device may be situated at orientations different from that implied by the directional terms used here. The same applies to the way in which the fabrication steps are performed in the invention. Inasmuch as directional terms are used for convenience to facilitate the description, the invention encompasses implementations in which the orientations differ from those strictly covered by the directional terms employed here.

While the invention has been described with reference to particular embodiments, this description is solely for the purpose of illustration and is not to be construed as limiting the scope of the invention claimed below. For example, the undercutting technique of the invention can be employed to form a segmented coating for a feature other than an electron focusing system. Techniques other than lift-off and electrochemical removal can be utilized to remove excess islands 56C, 56D, 108D, and 108E.

Instead of rotating composite deposition system 80/82 relative to the partially finished field emitter during the deposition of the focus coating material, deposition system 80/82 can be switched between a pair of opposite positions in which principal deposition axis 84 lies in a vertical plane extending in the column direction. With the rotation deleted during the coating material deposition, FIG. 4 qualitatively presents an example of these opposite positions. The coating material deposition is performed from one of the deposition positions for a selected period of time. After (substantially) stopping the deposition, deposition system 80/82 and the field emitter are rotated through an angle of 180° relative to each other to reach the other deposition position. The deposition is then performed from the second position for another selected time period.

Alternatively, the coating material deposition can be performed from two or more pairs of opposite positions. One of the pairs of opposite deposition positions can be the same as described in the preceding paragraph. In another of the pairs of opposite positions, principal deposition axis 84 can lie in a vertical plane extending in the row direction. These four positions are thus achieved by rotating deposition system 80/82 and the field emitter through 90° angles relative to each other during periods between deposition.

The masked etch of blanket excess emitter-material layer 56B can be performed in such a way that substantially all, rather than just part, of each composite control electrode 46A/50B is covered with excess emitter material, all of the excess emitter material being removed from the areas between control electrodes 46A/50B. The electrochemical removal procedure of the invention can be performed long enough to create openings through patterned excess-emitter material islands 56C for exposing electron-emissive cones 56A but not long enough to remove all of islands 56C. By combining these two variations, the remaining excess emitter material situated on composite control electrodes 46A/50B can serve as parts of electrodes 46A/50B to increase their current-conduction capability.

Techniques other than a masked etch can be employed in patterning excess emitter-material layer 56B to form islands 56C in the process of FIGS. 2, 5, or 6. For instance, before depositing the emitter material to create cones 56A and excess layer 56B, portions of a readily removable material such as photoresist can be provided over the areas of the field emitter where the portions of excess layer 56B are to be removed in defining islands 56C. After depositing the emitter material, the readily removable material is removed to lift off the overlying portion of layer 56B, thereby leaving islands 56C. Islands 108B and 108C in the process of FIG. 7 can be formed in the same way.

Gate layer 50A can be patterned to form gate portions 50B before depositing the emitter cone material to create electron-emissive elements 56A and excess emitter-material layer 56B, and typically also before creating dielectric openings 54. The combination of each main control electrode 46A and the adjoining gate portions 50B then forms a composite control electrode 46A/50B prior to depositing the emitter material.

Main control electrodes 46A can be formed after depositing gate layer 50. In that case, control electrodes 46A overlie, rather than underlie, gate portions 50B. Also, each main control electrode 46A and adjoining gate portions 50B can be replaced with a single-layer gate electrode have gate openings but no openings analogous to control apertures 48.

The etch of excess emitter-material islands 56C to form excess islands 56D can be deleted in the process variation of FIGS. 5 or 6. The deletion of this etch step can be performed even though each excess island 56C is of greater dimension in the row or column direction than overlying protective island 70B. When this etch step is deleted, portions of the focus coating material typically accumulate on the sidewalls of excess islands 56C during the focus coating deposition so as to increase the size of coating segments 78E. These portions of coating segments 78E typically break off or are otherwise removed during the removal of island tops 72A/78D.

In the process of FIG. 7, gate openings 52 can be created after further dielectric layer 100 is patterned to create layer 100A and form openings 102. Dielectric openings 54 are then etched through dielectric layer 44 followed by the creation of parting layer 104.

The processes of FIGS. 2 and 5–7 can be revised to make electron-emissive elements of non-conical shape. As an example, deposition of the emitter material can be terminated before fully closing the openings through which the emitter material enters dielectric openings 54. Electron-emissive elements 56A or 108A are then formed generally in the shape of truncated cones.

The electron emitters produced according to the invention can be employed in flat-panel devices other than flat-panel CRT displays. Various modifications and applications may thus be made by those skilled in the art without departing from the true scope and spirit of the invention as defined in the appended claims.

I claim:

1. A method comprising the steps of:

creating a first region over a primary component of a structure that includes electron-emissive elements;

forming a second region over part of the first region;

etching the first region so as to undercut the second region and form a gap below part of the second region; and providing coating material over the primary component and the second region to form a coating comprising first and second coating segments spaced apart along the gap such that (a) the first coating segment overlies the primary component and (b) the second coating segment overlies the second region.

2. A method as in claim 1 wherein the primary component and the coating are electrically non-insulating.

3. A method as in claim 2 wherein the second region is electrically non-conductive.

4. A method as in claim 3 wherein the first region is electrically non-conductive.

5. A method as in claim 1 wherein:

each of the primary component and the coating consists largely of electrically conductive material; and each of the regions consists largely of electrically insulating material.

6. A method as in claim 1 wherein the second region extends laterally beyond the first region.

7. A method as in claim 1 wherein the providing step entails forming the second coating segment so as to extend over a further component spaced laterally apart from the primary component.

8. A method as in claim 7 wherein the creating step entails creating the first region to extend laterally beyond the primary component and over a substructure in space between the components.

9. A method as in claim 7 wherein the second region overlies part of the further component.

10. A method as in claim 7 wherein the second region overlies part of the primary component.

11. A method as in claim 1 wherein the providing step comprises physically depositing the coating material.

12. A method as in claim 11 wherein the providing step entails depositing the coating material at a principal incidence angle of 20–90° to the upper surface of a substructure underlying the primary component.

13. A method as in claim 12 wherein the providing step further entails depositing the coating material from a deposition source as the substructure and the deposition source are translated relative to each other.

14. A method as in claim 12 wherein the providing step further entails depositing the coating material from a deposition source as the substructure and the deposition source are rotated relative to each other about an axis approximately perpendicular to the upper surface of the substructure.

15. A method as in claim 1 wherein, in addition to the undercutting of the second region, the etching step entails removing material of the first region not covered by the second region or by any other masking material overlying the first region.

16. A method as in claim 1 wherein the etching step is performed in at least a partially isotropic manner.

17. A method as in claim 16 wherein the etching step is performed with liquid etchant.

18. A method as in claim 1 further including, subsequent to the providing step, the step of removing the first coating segment.

19. A method as in claim 1 further including, subsequent to the providing step, the step of removing the second region and the second coating segment.

20. A method as in claim 19 wherein the removing step comprises mechanically displacing the second region from a substructure underlying the primary component.

21. A method comprising the steps of:

furnishing an initial structure in which a control electrode overlies a dielectric layer, a multiplicity of electron-emissive elements are situated in at least one opening extending through the control electrode and the dielectric layer, and a further layer overlies the control electrode;

creating a first region over the further layer and the control electrode;

forming a second region over part of the first region;

etching the first region so as to undercut the second region and form a gap below part of the second region; and providing coating material over the control electrode, the further layer, and the second region to form a coating comprising first and second coating segments spaced apart along the gap such that (a) the first coating segment overlies the further layer and the control electrode and (b) the second coating segment overlies the second region.

22. A method as in claim 21 further including, subsequent to the providing step, the step of removing the further layer and overlying material of the first coating segment.

23. A method as in claim 22 wherein the creating step entails creating the first region to extend laterally beyond the further layer and the control electrode.

24. A method as in claim 22 wherein:

the electron-emissive elements comprise electrically non-insulating emitter material; and the providing step entails providing the further layer as an excess layer of the emitter material such that the excess layer overlies the control electrode above the electron-emissive elements.

25. A method as in claim 24 wherein the coating is electrically non-insulating.

26. A method as in claim 25 wherein the second region is electrically non-conductive.

27. A method as in claim 25 wherein the first region is electrically non-conductive.

28. A method as in claim 24 wherein the second coating segment constitutes at least part of a system for focusing electrons emitted by the electron-emissive elements.

29. A method as in claim 21 wherein the providing step entails forming the second coating segment to extend over an additional electrical conductor spaced laterally apart from the control electrode.

30. A method as in claim 29 wherein the second coating segment constitutes at least part of a system for focusing electrons emitted by the electron-emissive elements, a focus control potential being appliable to the additional conductor.

31. A method as in claim 21 wherein the providing step further entails physically depositing the coating material.

32. A method as in claim 31 wherein the providing step further entails depositing the coating material at a principal incidence angle of 20–90° to the upper surface of a substructure underlying the dielectric layer.

33. A method as in claim 32 wherein the providing step further entails depositing the coating material from a deposition source as the substructure and the deposition source are translated relative to each other.

34. A method as in claim 32 wherein the providing step further entails depositing the coating material from a deposition source as the substructure and the deposition source are rotated relative to each other about an axis approximately perpendicular to the upper surface of the substructure.

35. A method as in claim 21 wherein the creating step entails creating the first region to extend laterally beyond the further layer and the control electrode.

36. A method as in claim 21 wherein:

the control electrode comprises a main control electrode through which a control aperture extends;

an electrically non-insulating gate portion spans the control aperture; and the electron-emissive elements are exposed through gate openings extending through the gate portion within span of the control aperture.

37. A method comprising the steps of:

furnishing an initial structure in which a control electrode overlies a dielectric layer, a multiplicity of electron-emissive elements comprising electrically non-insulating emitter material are situated in at least one opening extending through the control electrode and the dielectric layer, and an excess region comprising the emitter material overlies the control electrode;

creating a first region over the control electrode and the excess region;

forming a second region over part of the first region;

etching the first region so as to undercut the second region and form a gap below part of the second region;

providing coating material over the control electrode, the excess layer, and the second region to form a coating comprising first and second coating segments spaced part along the gap such that (a) the first coating segment overlies the excess layer and the control electrode and (b) the second coating segment overlies the second region.

38. A method as in claim 37 further including, subsequent to the providing step, the step of removing the excess region, the first region, the second region, and the second coating segment.

39. A method as in claim 38 wherein the removing step comprises mechanically displacing the regions away from the dielectric layer.

40. A method as in claim 38 wherein:

the control electrode comprises a main control electrode through which a control aperture extends;

an electrically non-insulating gate portion spans the control aperture; and the electron-emissive elements are exposed through gate openings extending through the gate portion within span of the control aperture.

41. A method comprising the steps of:

furnishing an initial structure in which a control electrode overlies a dielectric layer, a multiplicity of electron-emissive elements comprising electrically non-insulating emitter material are situated in at least one opening extending through the control electrode and the dielectric layer, and a first region comprising the emitter material overlies the control electrode above the electron-emissive elements;

creating a second region over part of the first region;

etching the first region so as to undercut the second region and form a gap below part of the second region;

providing coating material over the control electrode and the second region to form a coating comprising first and second coating segments spaced apart along the gap such that (a) the first coating segment overlies the control electrode and (b) the second coating segment overlies the second region.

42. A method as in claim 41 further including, subsequent to the providing step, the step of removing the first region, the second region, and the second coating segment.

43. A method as in claim 42 wherein the removing step comprises mechanically displacing the regions away from the dielectric layer.

44. A method as in claim 42 wherein the furnishing step includes furnishing the initial structure with a further dielectric layer situated (a) laterally beyond the electron-emissive elements and (b) between the first region and the control electrode.

* * * * *

UNITED STATES PATENT AND TRADEMARK OFFICE
CERTIFICATE OF CORRECTION

PATENT NO. : 6,008,062
ISSUE DATE : 12/28/1999
INVENTOR(S) : Knall, N. Johan

It is certified that errors appears in the above-identified patent and that said Letters Patent is hereby corrected as shown below:

Column 1, line 8, ", attorney docket no. CT-C092 US" should be deleted.

Column 2, line 56, "electrodes" should read --electrode--.

Column 3, lines 1 and 2, "the control electrode above" should be deleted;
line 33, "structure" should read --structural--.

Column 4, line 24, --that manufactured-- should be inserted between "or" and "according".

Column 5, line 34, --and 24-- should be inserted after "22".

Column 6, line 9, "Fig. ld" should read -- Fig. le--.

Column 7, line 6, "the", first occurrence should read --a--;
line 17, --(not separately shown in Fig. 2a)-- should be inserted after "layer";
line 23, --In Fig. 2a, the row direction extends horizontally, parallel to the plane of the figure.-- should be inserted after "trodes." at the end of the paragraph;
line 25, "depicted" should read --indicated--;
line 33, --(not separately shown in Fig. 2a)-- should be inserted after "layer";
line 58, --In Fig. 2a, the column direction extends perpendicular to the plane of the figure-- should be inserted after "trodes." at the end of the paragraph;
line 61, --One such control aperture 48 is depicted in Fig. 2a.-- should be inserted after "layer 44.".

UNITED STATES PATENT AND TRADEMARK OFFICE
CERTIFICATE OF CORRECTION

PATENT NO. : 6,008,062
ISSUE DATE : 12/28/1999
INVENTOR(S) : Knall, N. Johan

It is certified that errors appears in the above-identified patent and that said Letters Patent is hereby corrected as shown below:

Column 8, line 21, "a location" should read --locations--; "space" should read --spaces--;
line 57, --, now allowed-- should be inserted after "1996".

Column 12, lines 3 and 4, "polymerizable" should read --photopolymerizable--;
line 28, --, now allowed-- should be inserted after "1997".

Column 14, line 45, "disclose" should read --disclosed--;
line 47, --, now allowed-- should be inserted after "1997".

Column 16, line 16, "islands 72A" should read --island 72A--;
line 31, "island", second occurrence, should read --islands--.

Column 18, line 25, "56C" should read --56D--;
line 27, "56C" should read --56D--;
line 28, "56C" should read --56D--.

Column 19, line 12, "process of" should read --process sequence of--.

Column 21, line 59, "Items" should read --Item--;
line 60, "Fig. 7d" should read --Fig. 7g--.

Column 23, line 30, "row" should read --column--.

UNITED STATES PATENT AND TRADEMARK OFFICE
CERTIFICATE OF CORRECTION

PATENT NO. : 6,008,062
ISSUE DATE : 12/28/1999
INVENTOR(S) : Knall, N. Johan

It is certified that errors appears in the above-identified patent and that said Letters Patent is hereby corrected as shown below:

Claim 1, second line, "a first region" should read --a patterned first region--.

Claim 24, sixth line, "the control electrode above" should be deleted.

Claim 37, thirteenth line, --and-- should be inserted after "part of the second region;".

Claim 41, twelfth line, --and-- should be inserted after "part of the second region;".

In the abstract, second line, "a first region (26)" should read --a patterned first region (26)--.

Signed and Sealed this

Twenty-fourth Day of April, 2001

*Attest:*

NICHOLAS P. GODICI

*Attesting Officer*

*Acting Director of the United States Patent and Trademark Office*